US 6,701,259 B2

(12) United States Patent
Dor et al.

(10) Patent No.: US 6,701,259 B2
(45) Date of Patent: Mar. 2, 2004

(54) DEFECT SOURCE IDENTIFIER

(75) Inventors: Amos Dor, Sunnyvale, CA (US); Maya Radzinski, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/905,607

(22) Filed: Jul. 13, 2001

(65) Prior Publication Data
US 2002/0161532 A1 Oct. 31, 2002

Related U.S. Application Data
(60) Provisional application No. 60/237,297, filed on Oct. 2, 2000, and provisional application No. 60/240,631, filed on Oct. 16, 2000.

(51) Int. Cl.[7] .......................... G01N 21/95; H01L 21/66
(52) U.S. Cl. .......................... 702/35; 700/110; 709/224
(58) Field of Search .............................. 700/110, 121; 702/35; 356/237.1; 709/224

(56) References Cited

U.S. PATENT DOCUMENTS

| 5,539,752 | A | | 7/1996 | Berezin et al. ............. 371/22.1 |
|---|---|---|---|---|
| 5,544,256 | A | | 8/1996 | Brecher et al. ............. 382/149 |
| 5,598,341 | A | | 1/1997 | Ling et al. ............. 364/468.17 |
| 5,761,064 | A | * | 6/1998 | La et al. ........................ 702/35 |
| 5,774,222 | A | | 6/1998 | Maeda et al. ............... 356/394 |
| 5,801,965 | A | * | 9/1998 | Takagi et al. ................. 702/35 |
| 5,862,055 | A | | 1/1999 | Chen et al. ............. 364/468.28 |
| 5,923,430 | A | | 7/1999 | Worster et al. ............. 356/394 |
| 5,949,901 | A | | 9/1999 | Nichani et al. ............. 382/149 |
| 5,959,459 | A | | 9/1999 | Satya et al. .................. 324/751 |
| 5,966,459 | A | | 10/1999 | Chen et al. .................. 382/149 |
| 6,016,562 | A | | 1/2000 | Miyazaki et al. ............. 714/724 |
| 6,167,448 | A | | 12/2000 | Hemphill et al. ............ 709/224 |
| 6,246,787 | B1 | * | 6/2001 | Hennessey et al. ....... 356/237.1 |
| 6,314,379 | B1 | * | 11/2001 | Hu et al. ........................ 702/35 |
| 6,408,219 | B2 | * | 6/2002 | Lamey et al. ............... 700/110 |
| 6,438,438 | B1 | * | 8/2002 | Takagi et al. .................. 702/35 |

FOREIGN PATENT DOCUMENTS

| EP | 0 910 123 A1 | * | 4/1999 | ........... H01L/21/66 |
|---|---|---|---|---|
| WO | WO 99/59200 | | 11/1999 | ........... H01L/21/66 |

* cited by examiner

Primary Examiner—Kamini Shah
(74) Attorney, Agent, or Firm—Moser Patterson & Sheridan

(57) ABSTRACT

A method and associated apparatus of analyzing defects on semiconductor wafers. The method includes identifying defects on the semiconductor wafer. Defect inspection information is created within a defect source identifier client. The defect inspection information containing information regarding the identified defects. The defect inspection information is transmitted through a network to a defect source identifier server. Defect source information is derived at the defect source identifier server in response to the defect inspection information. The defect source information is transmitted from the defect source identifier server to the defect source identifier client. The defect source information is utilized at the defect source identifier client. In one aspect, the utilizing the defect solution information involves displaying defect solutions to the defect at the defect source identifier client in response to the defect solution information. In another aspect, utilizing the defect solution information involves altering the operation of the wafer processing system.

23 Claims, 14 Drawing Sheets

```
                                                              ┌─900
    LAYER ID [        ]
     LOT ID  [        ]
    WAFER ID [        ]

CAUSES FOR SELECTED DEFECT AND TOOLS
      ┌─902            ┌─904              ┌─906
```

| CAUSE | DESCRIPTION | |
|---|---|---|
| CAUSE 1 | CAUSE DESCRIPTION 1 | CASE IMAGES ─908 |
| CAUSE 2 | CAUSE DESCRIPTION 2 | CASE IMAGES ─908 |
| CAUSE 3 | CAUSE DESCRIPTION 3 | CASE IMAGES ─908 |

DEFECT REFERENCE SYSTEM

| CASE #28: ERROR CAUSED BY VALVE | CREATOR: SMITH | DATE: M/D/Y | |
|---|---|---|---|
| CASE BACKGROUND | | | |

| PLATFORM | CHAMBERS | PROCESS TYPES | PROCESSES |
|---|---|---|---|
| TOOLS | TWIN | CVD DIELECTRIC | TEOS |
| EQUIPMENT STATE | TYPE OF CLEANING | GASES | |
| RELEASED PROCESS | MICROWAVE | TEOS, $H_2$, He, $O_2$ | |

| CASE DETAILS |
|---|
| DETAILS, FACTS OR ISSUES CONCERNING THIS CASE<br><br>TEXT |

*Fig. 10*

DEFECT SOURCE IDENTIFIER

CROSS REFERENCE TO RELATED APPLICATION

This application also claims the benefit of No. 60/240,631 filed on Oct. 16, 2000.

This application claims benefit of U.S. provisional patent application serial No. 60/237,297, filed Oct. 2, 2000, which is herein incorporated by reference. This application contains subject matter that is related to the subject matter described in U.S. patent application Ser. Nos. 09/905,313, 09/905,514 and 09/905,609, filed simultaneously herewith on Jul. 13, 2001, which are each incorporated herein by reference in their entireties.

BACKGROUND OF THE DISCLOSURE

1. Field of the Invention

The invention relates to a method or associated apparatus for performing defect analysis in a semiconductor wafer processing system. More particularly, the invention relates to a method and apparatus that uses image analysis to analyze semiconductor wafers to determine defect causes and locations.

2. Description of the Background Art

Many techniques are used involving, e.g., optical systems, electron microscopes, spatial signature analysis, and energy dispersive x-ray microanalysis, to identify and analyze defects on a semiconductor wafer. To identify defects using the above defect analysis techniques, wafers are intermittently selected from a lot of wafers that is being processed, i.e., one in every N wafers is selected. The selected wafers are analyzed using one or more of the above-identified analysis techniques (these techniques are performed by tools that are commonly referred to as metrology tools). These techniques produce images and data representing a surface of the selected wafers. A skilled operator reviews the images and data recorded by the metrology tools to identify defects on the selected wafers. The source of the defect is generally identified through trial and error, i.e., changes are made in the process parameters in an attempt to eliminate the defect in a wafer selected from another lot. Some types of defects occur for well-known reasons. These defects are cataloged in a searchable database of defect data and images. An operator can compare the test results to the defect database in an attempt to match the test results to defects contained in the defect database. If a match is found, the database may identify the source of that particular type of defect. The operator can then take corrective action to eliminate the defect.

A relatively large amount of information relating to wafer defects is necessary to provide an illustrative sample of the varied and multiple defects that may occur to any semiconductor wafer that is being processed through a series of processes. Generally, a defect analysis system using a large amount of stored data can provide more effective defect comparisons than a defect analysis system using a small amount of stored data. Even large volume semiconductor processes will require a certain amount of time until sufficient numbers of wafers have been processed and analyzed to provide reliable defect source information. Unfortunately, processing semiconductor wafers is very expensive, and many companies or groups can only afford to process a relatively small number of semiconductor wafers through any prescribed set of processes for testing purposes.

Therefore, a need exists in the art for a system that can effectively analyze wafer defects and repeatedly utilize the defect source information through the use of a shared database of defect data that is accessible over a wide area network.

BRIEF DESCRIPTION OF THE DRAWINGS

The teachings of the present invention can be readily understood by considering the following detailed description in conjunction with the accompanying drawings, in which:

FIG. 9 shows a portion of a defect cause selection screen to be displayed by a defect source identifier;

FIG. 10 shows another portion of a defect cause selection screen to be displayed by a defect source identifier;

To facilitate understanding, identical reference numerals have been used, where possible, to designate identical elements that are common to the figures.

DETAILED DESCRIPTION

Figure 1:
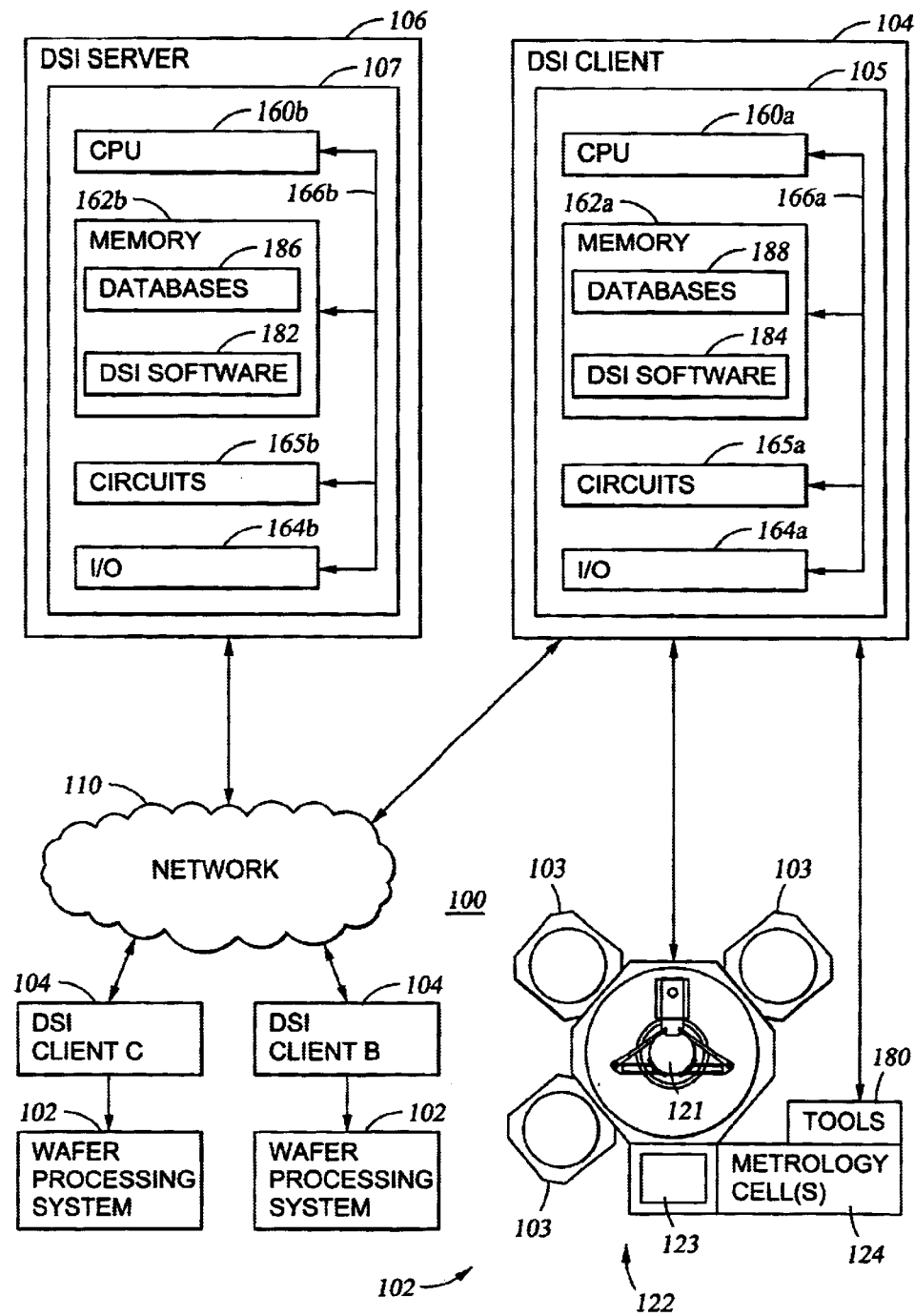
FIG. 1 shows one embodiment of a defect source identifier arranged in accordance with the present invention.

One embodiment of defect source identifier 100 is shown in FIG. 1 that identifies defects in the wafers processed by a wafer processing system 102. The wafer processing system 102 includes one or more process cells 103. Each one of the process cells is configured to perform such exemplary processes on wafers as chemical vapor deposition (CVD), physical vapor deposition (PVD), electrochemical plating (ECP), electroless deposition, other known deposition processes, or other known etching processes. The defect source identifier 100 includes metrology tools that analyze defects that have occurred in wafers during processing within the wafer processing system 102. Certain embodiments of the defect source identifier 100 transfers wafer data, images, and/or information relating to the wafer defects to a remote location for analysis. Certain embodiments of the defect source identifier 100 compare wafer images to case histories of wafer defects, performs spectral analysis on the wafer, and/or transfers defect sources and operational solutions to defects to the wafer processing system (or to an operator located at the wafer processing system). The defect source identifier 100 analyzes undesired operation of and/or the states of one or more of the process cells as evidenced by defects in the wafers that have been processed within the process cells as well as the states of the process cells. Wafers that may undergo processing in process cells include semiconductor wafers or some other form of substrate upon which sequential process steps are performed.

The embodiment of defect source identifier 100 shown in FIG. 1 includes a wafer processing system 102, one or more defect source identifier clients 104, one or more defect source identifier servers 106, and a network 110. The wafer processing system 102 includes a transfer cell 122 (also known as a factory interface), a plurality of process cells 103, and a wafer transfer system 121 (also referred to as a wafer transport robot or simply a robot), and a factory interface 122. The factory interface 122 includes a cassette load lock 123 and a metrology cell 124. The cassette load lock 123 stores one or more wafer cassettes. The individual wafers are moved from the cassette 123 to the process cells 103 by the robot 121. The metrology cell 124 includes metrology tools 180 that measure and test the wafer characteristics and wafer defects. The metrology tools include, e.g., a scanning or transmission scanning electron microscope, an optical wafer defect inspection system, spatial signature analysis, or any metrology tool used to analyze defects of wafers, either in combination or individually.

A plurality of defect source identifier clients 104 are shown in the embodiment of FIG. 1 as defect source identifier clients A, B, and C. The following description references the defect source identifier client A, but is representative of all of the defect source identifier clients. The defect source identifier client 104 includes the client computer 105 to control the operation of both the wafer processing system 102 and the individual process cells 103 in the wafer processing system 102. The defect source identifier server 106 includes the server computer 107.

The client computer 105 interacts with the server computer 107 via the network 110 to receive data stored in the server computer 107 that relates to present and historical (i.e., case study) defects on wafers processed by the wafer processing system 102. As such, the client computer 105 and the server computer 107 interact with the metrology tools 180 of the metrology cell 124 and a variety of databases 186 that store wafer defect case histories to analyze defect generation in the wafer processing system 102. The network 110 provides data communications between the client computer 105 and the server computer 107. The network 110 may utilize the Internet, an intranet, a wide area network (WAN), or any other form of a network. It is envisioned that the network 110 may utilize such computer languages utilized by, e.g., the Internet such as Hypertext Markup Language (HTML) or extensible Markup Language (XML). HTML is presently the predominant markup language utilized over the Internet. XML is a markup language that is gaining greater acceptance in the Internet. The use of HTML and/or XML requires the use of a respective HTML and/or XML browser installed at each client computer 105.

The client 104 and the defect source identifier server 106 interact to identify defects on processed semiconductor wafers and provide solutions to the wafer defects. The operation of the wafer processing system 102 is controlled by a particular defect source identifier client 104. In certain embodiments of defect source identifier 100, the defect source identifier client 104 receives solutions from the defect source identifier server 106. The solutions are applied to the wafer processing system 102 (either automatically or input from an operator), and the solutions are used to control the operation of the wafer processing system.

Since the operation and function of the client computer 105 and the server computer 107 are so closely related, and similar client/server operations can be performed by either the client computer 105 or the server computer 107. In this disclosure the reference number of elements in the client computer 105 are appended with an additional reference character "a". In a similar manner, the reference characters of the server computer 107, are appended with an additional reference character "b". In sections of the disclosure in which it is important to differentiate the elements of the client computer 105 from the elements of the server computer 107, the suitable respective reference character "a" or "b" is provided. In sections of the disclosure that either or both of an element of the client computer 105 or a server computer 107 can perform the prescribed task, the appended letter following the reference character may be omitted.

The respective client computer 105 and server computer 107 comprise a respective central processing unit (CPU) 160a, 160b; a memory 162a, 162b; support circuits 165a, 165b; an input/output interface (I/O) 164a, 164b; and a bus 116a, 166b. The client computer 105 and the server computer 107 may each be fashioned as a general-purpose computer, a workstation computer, a personal computer, a laptop computer, a microprocessor, a microcontroller, an analog computer, a digital computer, a microchip, a microcomputer, or any other known suitable type of computer. The CPU 160a, 160b performs the processing and arithmetic operations for the respective client computer 105 and server computer 107.

The memory 162a, 162b includes random access memory (RAM), read only memory (ROM), removable storage, disk drive storage, that whether singly or in combination store the computer programs, operands, operators, dimensional values, wafer process recipes and configurations, and other parameters that control the defect source identification process and the wafer processing system operation. Each bus 166a, 166b in the client computer 105 or the server computer 107, provides for digital information transmissions between respective CPU 160a, 160b; respective support circuits 165a, 165b; respective memory 162a, 162b; and respective I/O 164a, 164b. The bus 166a, 166b in the client computer 105 or the server computer 107 also connects respective I/O 164a, 164b to other portions of the wafer processing system 102.

I/O 164a, 164b provides an interface to control the transmissions of digital information between each of the elements in the client computer 105 and/or the server computer 107. I/O 164a, 164b also provides an interface between the elements of the client computer 105 and/or the server computer 107 and different portions of the wafer processing system 102. Support circuits 165a, 165b comprise well-known circuits that are used in a computer such as clocks, cache, power supplies, other user interface circuits, such as a display and keyboard, system devices, and other accessories associated with the client computer 105 and/or the server computer 107.

To collect defect information, the client 104 is coupled to one or more metrology tools 180 within the wafer processing system 102. The metrology tools that can perform a desired inspection on the wafer in the metrology cell 124 or cells, include optical-based wafer defect inspection process, a scanning electron microscope process, and/or other wafer defect tools or processes. As described in detail below, the defect data collected by the client 104 is shared with the DSI server 106 via the I/O 164-, 164b and network 110. This defect data as well as process information is stored in various databases 186. Client databases 188 are used to support various processes in the client 104.

The defect source identifier 100 utilizes an automated defect source identification software program 182, 184, portions of which are stored in the memory 162a or 162b to run respectively on the client computer 105 and the server computer 107. The defect source identifier 100 automatically derives the source of a defect and either displays the possible causes with minimal user intervention and/or automatically remedies the process situation in the wafer processing system 102 that lead to the defect. Due to the automation of certain embodiments of defect source identifier 100 (and the production of possible solutions to certain defects by referencing historical defect case information). The defect source identifier 100 reduces problem solving cycle time, simplifies the defect source identifying process, and improves defect identification accuracy.

The defect source identifier 100 may be organized as a network-based application that generates an executive summary screen that is typically subdivided into a plurality of graphical user interface screen. In one embodiment, the graphical user interface screen displays its interfaces and defect sources at the defect source identifier client 104. The users at the defect source identifier client 104 can thus interact with the defect knowledge database at the defect source identifier client to populate the executive summary screen. In another embodiment, the defect source identifier 100 can be configured as a stand-alone system contained in the defect source identifier client 104 that can operate without the network 110 and the defect source identifier server 106. The selected configuration of the defect source identifier depends largely on the desired operation and performance characteristics of the system 100.

Defect Source Identifier Operation and Structure

Figure 2:
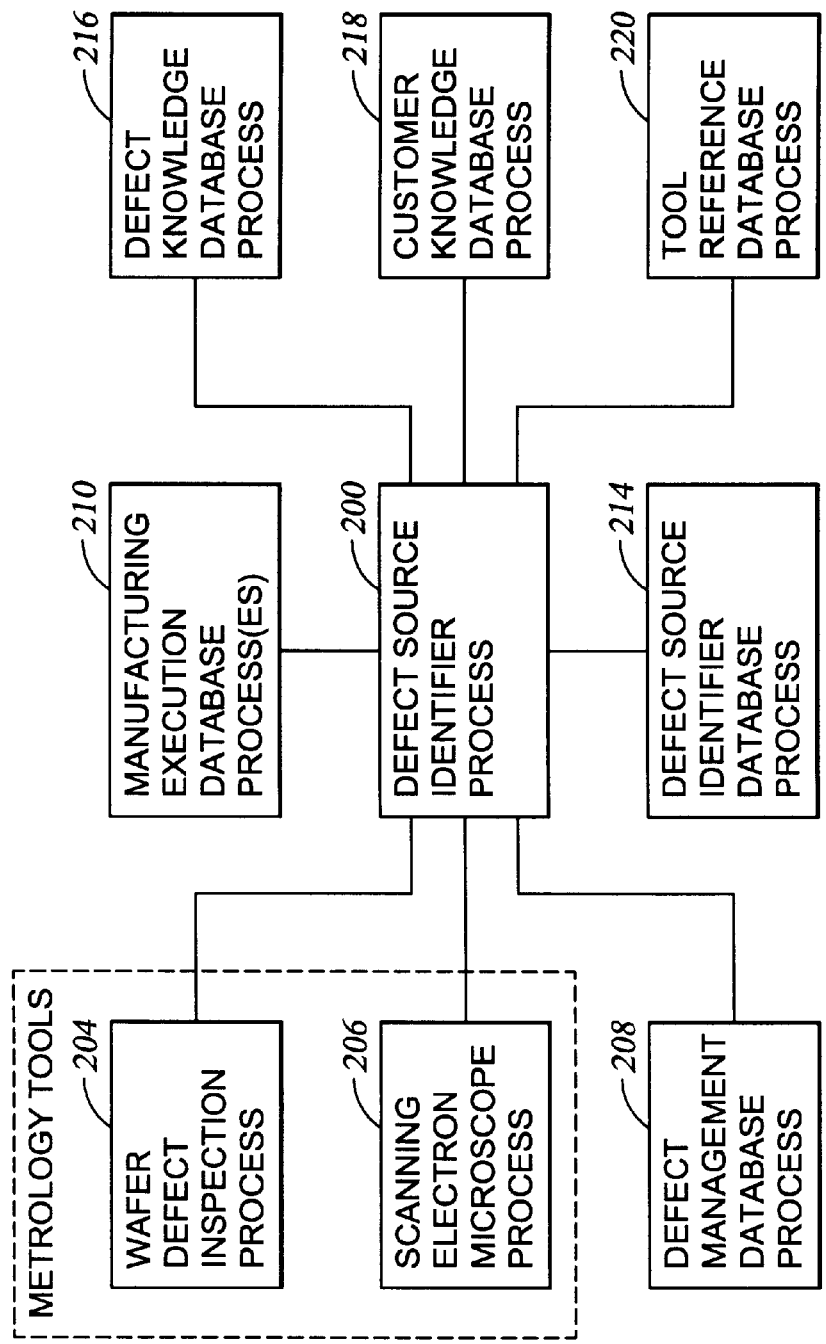
FIG. 2 shows a block diagram illustrating the processes performed by the defect source identifier of FIG. 1

Different embodiments of the defect source identifier 100 receive data, text, images, defect case histories, etc. from one or more of a wide variety of databases, optical wafer inspection processes, and/or scanning electron microscope processes. FIG. 2 shows one embodiment of the interrelated processes utilized by the defect source identifier 100. The varied processes included in the embodiment of the defect source identifier 100 shown in FIG. 2 comprise a defect source identifier process 200, an (optical) wafer defect inspection process 204, a scanning electron microscope process 206, a defect management database process 208, a manufacturing execution database process 210 (that may be operationally and/or structurally subdivided into a distinct FAB manufacturing execution database process and/or a routing workstation manufacturing execution database process), a defect source identifier database process 214, a defect knowledge database process 216 (also referred to as a defect knowledge library), a customer knowledge database process 218, and a tool reference database process 220. The defect knowledge database process 216 stores defect knowledge information while the customer knowledge database process 218 stores customer knowledge information. The defect knowledge information and the customer knowledge information may together be defined as defect source information. The reader should simultaneously refer to FIG. 1 and FIG. 2. Though the term "process" is used to describe processes 200, 204, 206, 208, 210, 216, 218, and 220, it is envisioned that certain ones of these processes may be fashioned using software, hardware, databases, metrology equipment, and/or any suitable component, as described to perform the function of the process.

The wafer defect inspection process 204 and the scanning electron microscope process 206 are characterized as metrology tools (180 in FIG. 1). The metrology tools may further comprise a variety of processes such as wafer defect analyzers, transmission electron microscope, spatial signature analysis, ion beam analyzers, etc. Other types of optical wafer defect inspection equipment may be utilized by the defect source identifier 100 in a similar manner as described. KLA-TENCOR® of San Jose, Calif. is a producer of optical wafer defect inspection equipment such as shown at 204 and/or 206. The defect images from the wafer defect inspection process 204 and/or the scanning electron microscope process 206 outputs detect information in the form of, e.g., a KLA file or KLA resource files (KLARF). The wafer defect inspection process 204 generates defect inspection information as a KLA file that can be utilized in, stored by, or displayed to users located at the defect source identifier client 104 or the defect source identifier server 106. The wafer defect inspection process produces a high resolution image of the wafer.

The scanning electron microscope process 206 is used to inspect the surface or subsurface of the wafer. One embodiment of the scanning electron microscope process automatically classifies general defect types as the defects are identified by the microscope. One embodiment of the scanning electron microscope process 206 generates defect inspection information as a "KLA file" that can be analyzed, stored, or displayed by the defect source identifier server 106 or the defect source identifier client 104.

An embodiment of the defect source identifier client 104 includes a display to view defect images referenced by the KLA files produced by such metrology tools as the wafer defect inspection process 204 or the scanning electron process 206. One embodiment of the defect source identifier 100 allows wafer defect case histories to be displayed on a display of the defect source identifier client 104. An image from a current defect may be displayed on the display beside the image of a case study defect (reference image) for comparison purposes. The defect source identifier system 100 creates and displays a wafer map image for each wafer that will visually indicate the location of defects on the wafer.

The defect management database process 208 stores and accesses defect images, data, and information. Such images, data, and other recently collected information may be utilized during repetitive wafer defect analysis of one or more wafers. Such repetitive wafer defect analysis may be utilized to provide defect repeater information (e.g., where a similar defect occurs at the same location of subsequent processed wafers) and adder information (where a similar defect has not occurred in a similar location in another wafer). The data, images, or other information may also provide cluster information, where multiple instances of a defect occur within a region.

The defect source identifier process 200 is coupled to the manufacturing execution database process 210. One embodiment of manufacturing execution database process 210 includes a WORKSTREAM® manufacturing execution system, manufactured by CONSILIUM® of Mountain View, Calif. The manufacturing execution database process 210 is a database application that controls the flow routes of the wafer lots utilized during the manufacturing process. As such, the manufacturing execution database process contains routing information about which processes have been applied to each wafer or wafer lot. Such lot routing information is useful in determining those processes (or series of processes) that wafers having defects have undergone.

The manufacturing execution database process 210 may also include an equipment interface and a recipe management system. The manufacturing execution database process 210 therefore contains considerable information about each process and condition used by the process cells 103 to process each wafer. The manufacturing execution database process 210 thus forms "context information" and forms a message to send to a recipe management system that is used to set the recipe for processing each wafer. The context information can be used to uniquely identify the process that is going to occur in a recipe in a specific process cell, and includes such information as lot number, entity, product, route, etc.

The recipe management system produces a "recipe" based on the message provided by the manufacturing execution database process 210. The recipe is essentially the process instructions, such as the pressure, temperature, gas flow, etc. for that product in that step. The manufacturing process steps are then performed by the respective processing tool in accordance with the setup and the recipe. Some data collection is performed by the wafer processing system 102 such as reports on when the processing began, ended, etc. This information is sent to the manufacturing execution database process 210 and stored, e.g., in a lot and entity record in the memory.

One embodiment of the defect source identifier process 200 is configured to allow transfer of data between the customer knowledge database process 218 and a defect knowledge database process 216 (a class cross-reference file is used to make this transfer).

The defect knowledge database process 216 is typically stored in the memory 162b of the server computer 107. The defect knowledge database process 216 stores case history defect data, images, and information obtained from a variety of sources, e.g., defect source identifier clients 104. The customer knowledge database process 218 is typically stored in the memory 162a of the client computer 105. The customer knowledge database process 218 stores and accesses case histories defect data, images, and information obtained from a single defect source identifier client 104. If a user has access to both the defect knowledge database process 216 and the customer knowledge database process 218, it will be important for the user to access databases in both the client 104 and the server 106 during a defect case history search.

In one embodiment of defect source identifier 100, if any one specific customer knowledge database process 218 supports one specific defect knowledge database process 216, at least some of the contents handled by the customer knowledge database process 218 (defect data, images, and information) will be allowed to be accessed by the defect knowledge database process 216.

One embodiment of the automated embodiments of defect source identifier 100 utilizes a software program 182, 184 that includes image processing and data analysis technology. The automated defect source identifier 100 matches current defects occurring in the wafer processing system 102 with previously collected defect inspection information. The defect knowledge database process 216 and a customer knowledge database process 218 cooperate to accumulate historical defect source information. Information for both the defect knowledge database process 216 and the customer knowledge database process 218 may be stored in either memory 162a and/or memory 162b.

The defect source identifier database process 214 stores and accesses data relating to the sources of defects. For each defect source, a list of defect solutions (e.g., possible corrective actions, that can be taken to correct certain defects) is stored.

The defect source identifier database 214 contains specific data from the KLA files produced by the optical wafer defect inspection process 204 and the scanning electron microscope process 206. The defect source identifier database 214 also contains file references to the inspection image files.

Certain embodiments of the defect source identifier clients 104 may utilize historic defect data, images or other information stored by both the customer reference database process 218 and/or the defect knowledge database process 216. The defect knowledge database process 216 stores and accesses images, data, or other information relating to the historical defect cases of the defect source identifier 100. The images, data, or other information in the defect knowledge database process 216 is preferably compiled by interaction, over time, with a plurality of individual defect source identifier clients 104.

Each defect source identifier client 104 may be operated by a different company or group. The customer knowledge database process 218 utilizes data, images, or other information relating to the defect case for a particular defect source identifier client 104. The larger the volume of data, images, or other information contained in any particular customer knowledge database process 218 or defect knowledge database process 216, the greater the potential number of historic water defects (and their solutions) that can be suitably analyzed and/or compared. For example, the historical defects relating to multiple defect source identifier clients 104 that are in communication with the defect source identifier server 106 may be stored as data in the memory 162b of the defect source identifier server 106. Only certain defect source identifier clients 104 may access the data, images, or other information contained in the defect knowledge database process 216.

One embodiment of the defect source identifier 100 is configured to allow access to historic case information stored by the defect knowledge database process 216 only if the customer knowledge database process 216 of that particular defect source identifier client supports the defect knowledge database process 216 of the defect source identifier server 106. If the customer knowledge database process 218 of a particular defect source identification client 104 supports the defect knowledge database process 216, then the individual customer knowledge database process 218 provides access to the historical defect cases in the defect source identifier client. Therefore, the defect source identifier client 104 can obtain historic data, images, or other information from only these defect knowledge database process if that defect source identifier client 104 supports (by allowing the defect source identifier server 106 to access the data, images, and other information contained in the customer knowledge database process).

Allowing a defect knowledge database process 216 to access data, images, or other information from a plurality of customer knowledge database processes 218 allows the defect knowledge database process to obtain historic defect data, images, or other information from a large variety of different defect source identifier clients 104. As such, the defect knowledge database process 216 becomes a repository of wafer defect data, images, or other information from a potential vast array of different defect source identifier clients 104. The different defect source identifier clients may or may not be operated by a variety of different companies or groups that process wafers differently so the wafers are exposed to a vast array of different wafer processing techniques and wafer defects.

As such, the data images, data, or other information relating to defects initially detected by a first defect source identifier client 104 operated by a first company or group may be later utilized for analysis purposes by a second defect source identifier client 104 operated by a different company or group. The identity of the company or group operating the first defect source identifier client 104 may not be available to the operators of the second defect source identifier clients. However, certain aspects of the process cell conditions, recipes, operating temperatures, and/or one or more solutions to the defect may be provided to the operators of the second defect source identifier client. Individual defect source identifier clients 104 might, or might not, individually process a sufficient number of wafers to compile sufficient data, images, or other information to make their individual customer knowledge systems reliable. The number historical wafer data, images, and information relating to most processes can be increased by utilizing the vast defect knowledge database process 216 that includes information from other defect source identifier clients 104.

An embodiment of the defect source identifier process 200 gathers such defect attributes as adders, repeaters, spatial signature analysis, and cluster information from the defect management database process 208 in near real-time. The defect source identifier process 200 gathers lot routing information from the manufacturing execution database process 210 in near real-time. The defect source identifier process 200 of selected system users may access the defect knowledge database process 216 and/or the customer knowledge database process 218. If the databases processes 216, 218 are available to a specific user, the users defect source identifier performs optimally when it utilizes the stored images, data, and other case history information from both the defect knowledge database process 216 and the customer knowledge database process 218. The defect knowledge database process and the customer knowledge database process may be each accessed through known database access programs and techniques such as ADO.

The images produced by the wafer defect inspection process 204 and the scanning electron microscope process 206 are typically in the form of TIFF files. Images, data, and other information in database processes 208, 210, 216, 218, 220, and 214 can also be stored in TIFF format. Multiple images may be contained in a single TIFF file in which the image file directory in the TIFF file contains multiple entries, one entry for each image. To contain multiple images in the same file, the file includes not only the multiple images, but also alignment data indicating the alignment of the different images in the file. Both alignment and defect image data are thus contained in TIFF file referenced in the KLA File. Storing multiple images in a single TIFF file avoids requiring a separate TIFF file for each image. The multiple mages associated with a single defect may be contained in a single, or multiple, TIFF file. Multiple TIFF files are defined by multiple TiffFileName records in the KLA File.

The defect source identifier system 100 is configured to convert TIFF defect image files to JPEG-compressed or MPEG-compressed image files because the compressed image files are readily transported between any one of the client computers 105 and the server computer 107. The defect source identifier process 200 connects to the scanning electron microscope process 206 and the optical wafer defect inspection process 204. This connection between processes 204 and 206 allows the user to access the process's 204, 206 historic KLA files and/or other image files. An embodiment of the defect source identifier process 200 supports retrieving a processing tool list from a flat file within the tool reference database process 220.

One embodiment of the defect source identifier server 106 shown in FIG. 1 utilizes a network server such as a WINDOWS NT® server, a MICROSOFT® Transaction Server, or a MICROSOFT® Internet Information Server. The defect source identification server 106 runs a defect source identifier database 186 using the CPU 160b to access memory 162b. One embodiment of the defect source identifier may use a database that is accessed by the defect source identifier servers 106, e.g. an SQL server database.

The defect source identification client 104 may contain well-known network client software that is designed to support interaction with the network server. The network client software includes an operating system such as WINDOWS NT®, SOLARIS® (a registered trademark of Sun Microsystems, Inc. of Palo Alto, Calif.), or IRIX® (a registered trademark of SGI of Mountain View, Calif.). The defect source identification client 104 runs a browser such as INTERNET EXPLORER® (a registered trademark of the Microsoft Corporation of Redmond, Wash.) or NETSCAPE NAVIGATOR® (a registered trademark of Netscape Communications Corporation of Mountain View, Calif.). The defect source identifier could be developed in such languages as VISUAL BASIC® (hereinafter referred to as VB) (a trademark of the Microsoft Corporation of Redmond, Wash.), C, C++, or other object-oriented or traditional computer programming languages.

In one embodiment, the defect source identifier server 106 executes the defect knowledge database process 216 and the customer knowledge database process 218 through the communication process of the defect knowledge database process 216, that is compatible with VB. The defect source identifier server 106 executes the manufacturing execution database process through communication processes that are compatible with VB. Certain embodiments of database software support enterprise networks, including ORACLE8i® from Oracle, QUEST™ Quest Software of Irvine, Calif., and KNIGHT™, through COM processes that are compatible with VB. A KLA result file (KLARF), or KLA file, is a flat ASCII file produced by computer equipment. The same format to save defect information processes 206 from both the optical wafer defect inspection process 204 and the scanning electron microscope process 206. The defect source identifier supports the KLA or KLARF files produced by the optical wafer defect inspection process 204 to capture specific parameters from the wafer defect inspection process. The KLARF and image files from the optical wafer defect inspection process 204 and the scanning electron microscope process 206 be exported by the tools onto a directory local to the tool. Each tool connected to the defect source identifier makes available their export directory as a Network File System (NFS) mountable file system.

Graphical User Interface Overview

Figure 4:
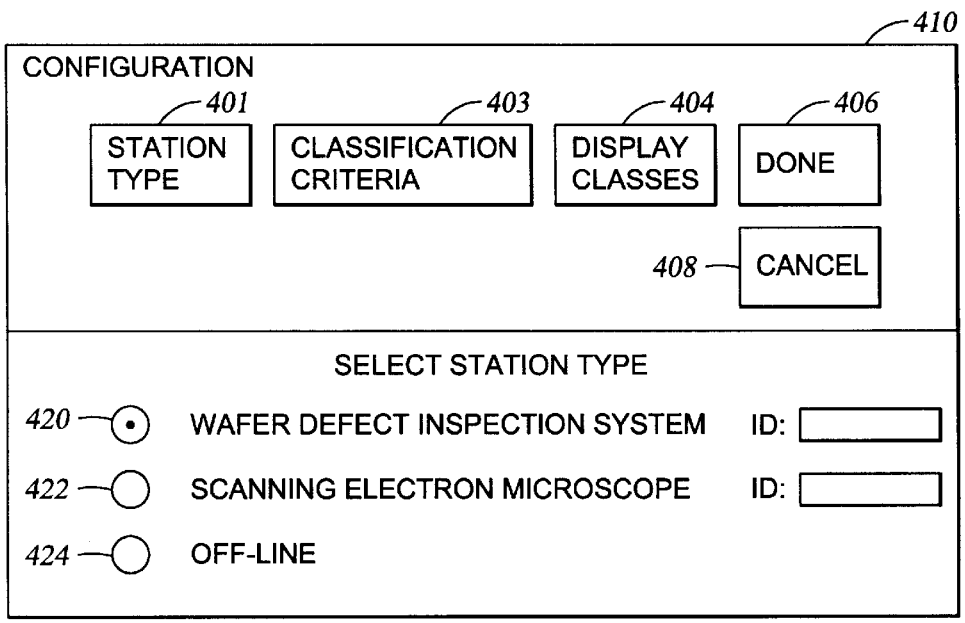
FIG. 4 shows a portion of a configuration screen to be displayed on a display of the defect source identifier.
Figure 5:
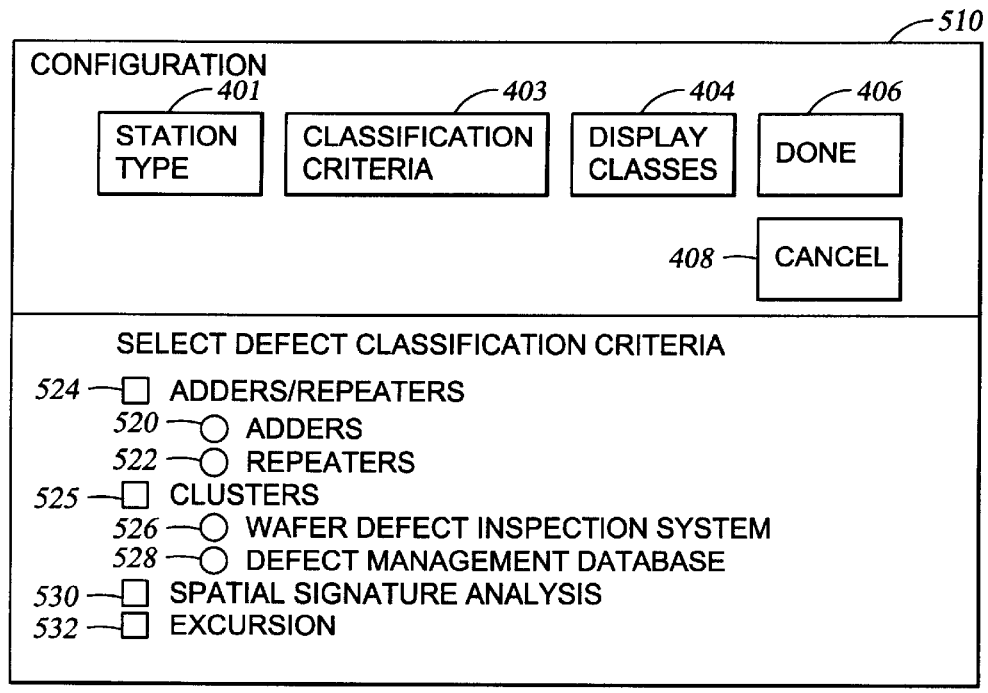
FIG. 5 shows another portion of a configuration screen to be displayed by a defect source identifier.
Figure 6:
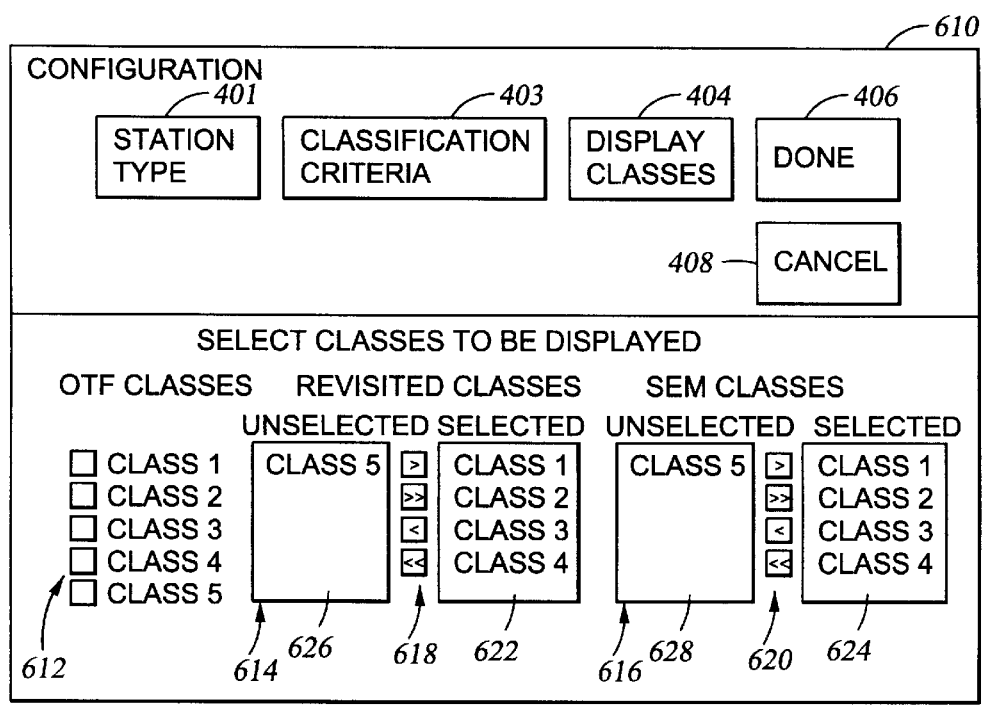
FIG. 6 shows another portion of a configuration screen to be displayed by a defect source identifier.
Figure 7:
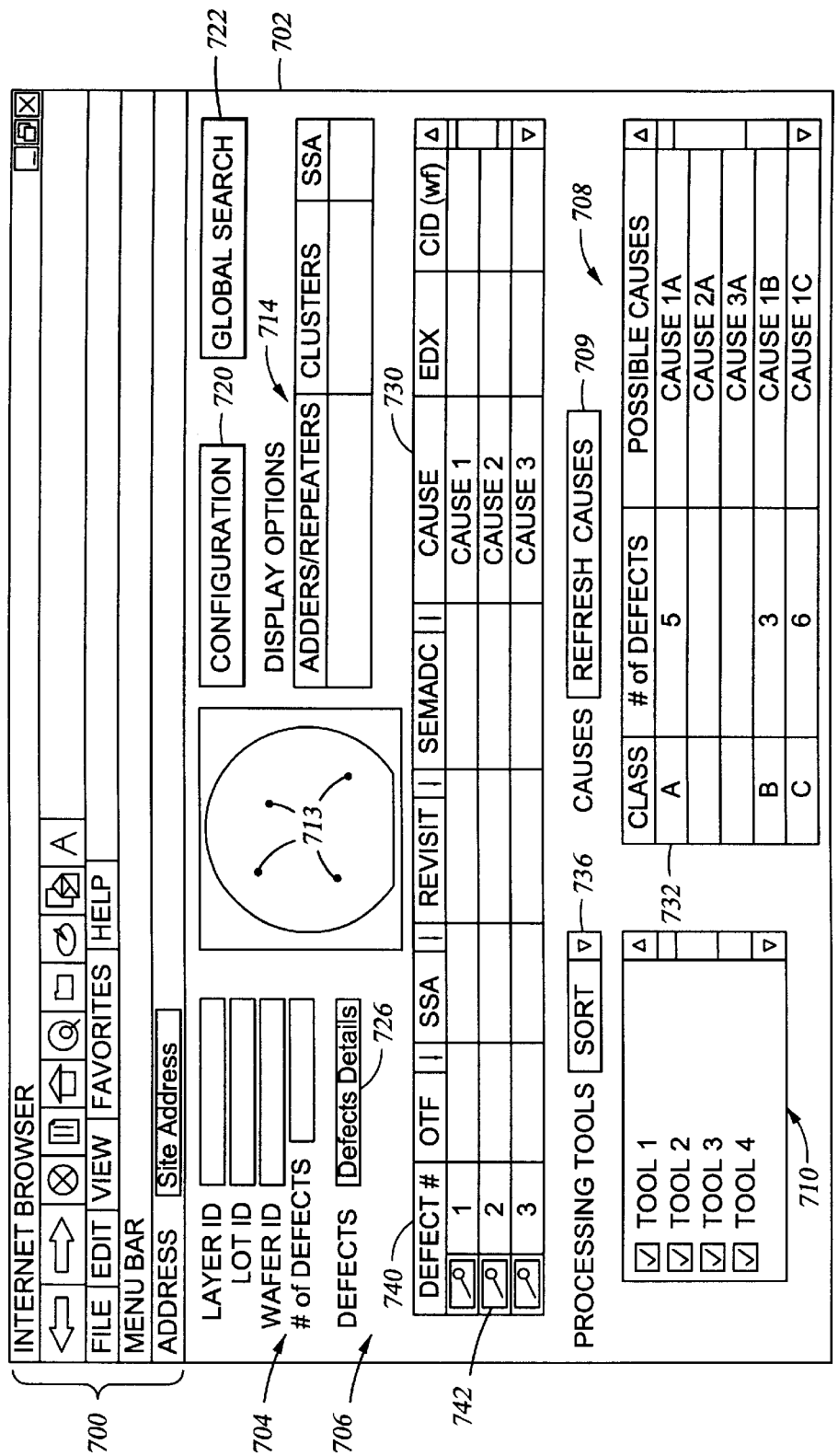
FIG. 7 shows another portion of a defect summary screen to be displayed by a defect source identifier.
Figure 8:
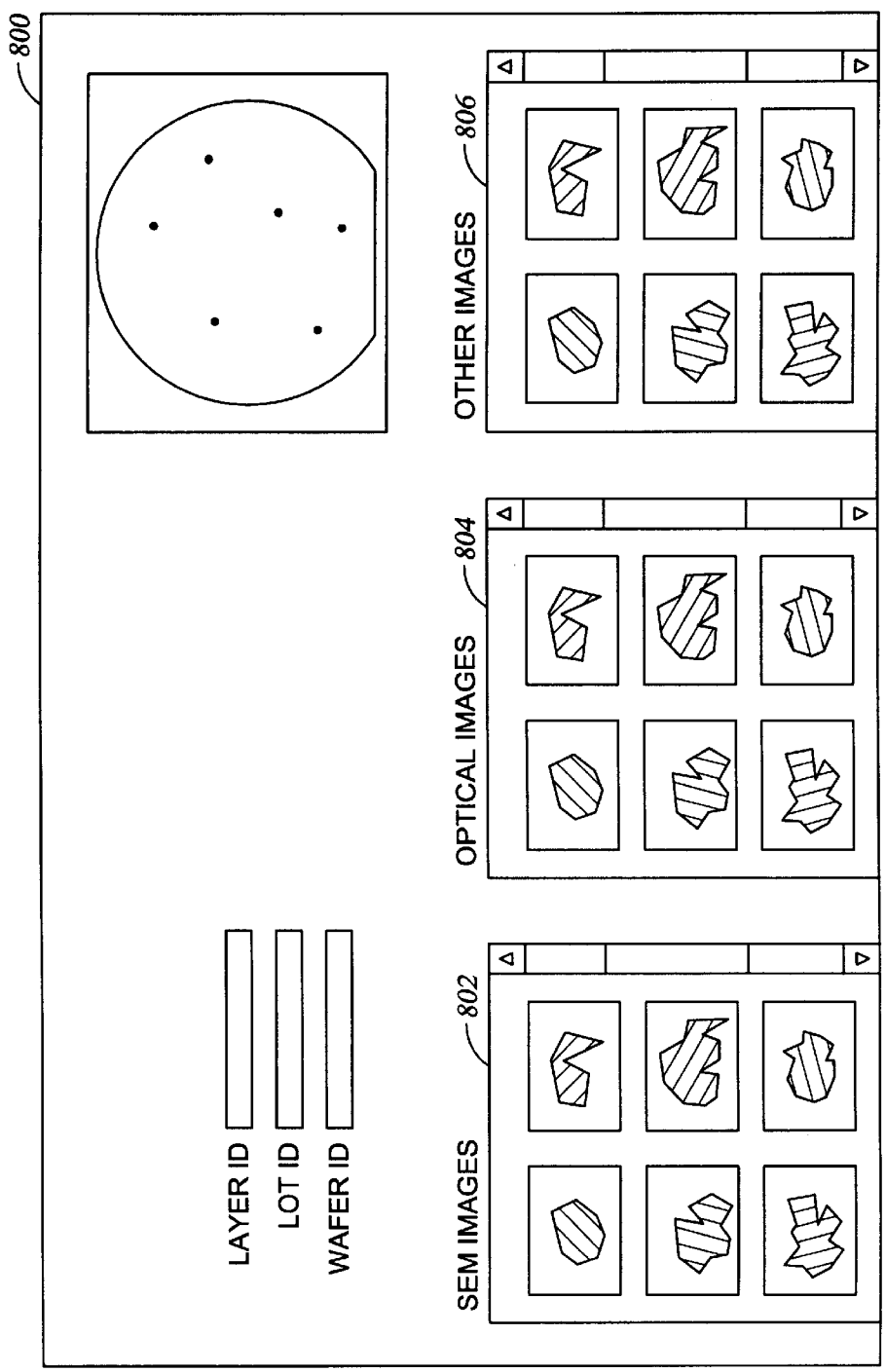
FIG. 8 shows a defect image screen to be displayed by a defect source identifier.
Figure 11:
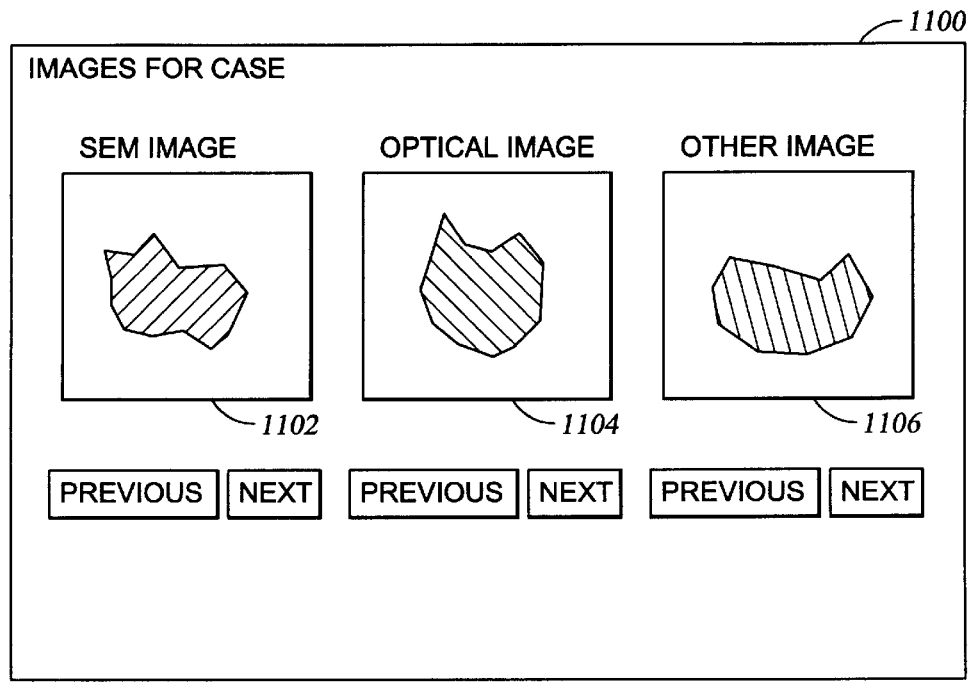
FIG. 11 shows a case image screen to be displayed by a defect source identifier.
Figure 12:
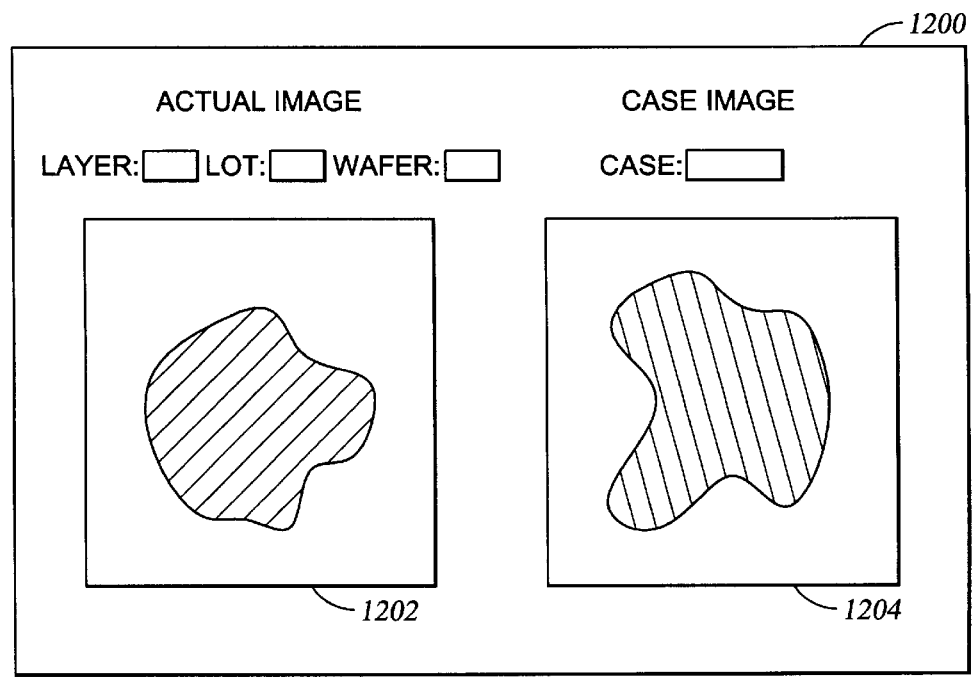
FIG. 12 shows an image compare screen to be displayed by a defect source identifier.
Figure 13:
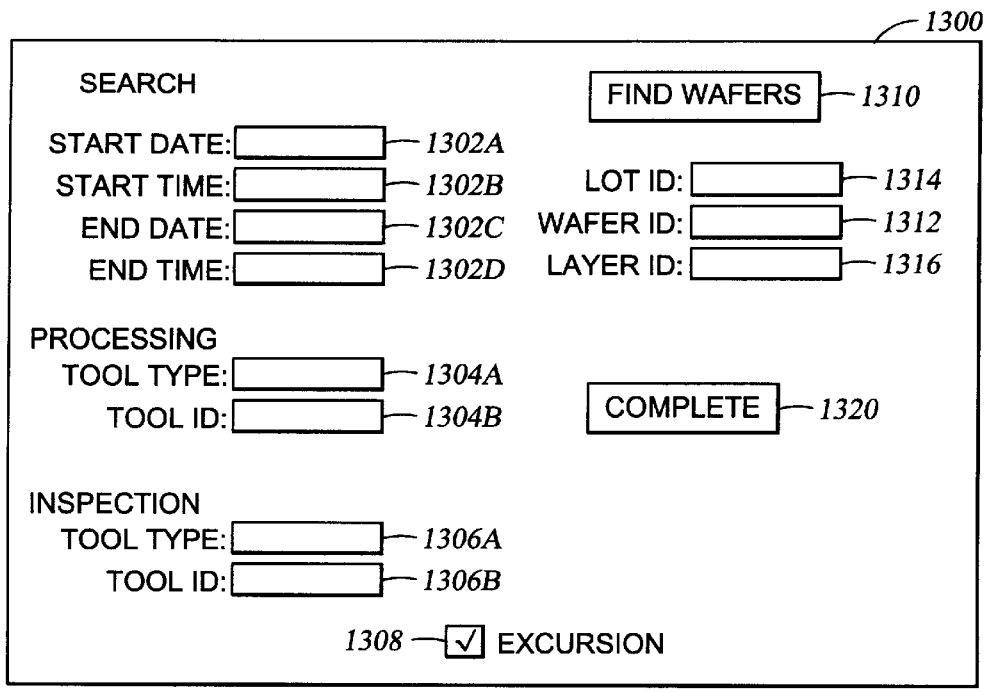
FIG. 13 shows a wafer search screen to be displayed by a defect source identifier.

A series of graphical user interface (GUI) may be displayed on, e.g., a screen, monitor, or other display associated with the respective I/O 164a, 164b on either the respective defect source identifier client 104, the defect source identifier server 106, or at a location in the network 110 in a manner to provide user interaction. The GUI display is typically located at the defect source identifier client 104 to provide user interactivity. The GUI of the defect source identifier 100 may display a series of interface screens within a browser window such as a login screen, a configuration screen that can contain multiple segments as shown in FIGS. 4 to 6, a defect summary screen one embodiment of which is one embodiment of which is shown in FIG. 7, a defect image screen that may contain multiple screens one embodiment of which is in FIGS. 9 and 10, a case image screen one embodiment of which is shown in FIG. 11, an image compare screen one embodiment of which is shown in FIG. 12, and a wafer compare screen one embodiment of which is shown in FIG. 13. These GUI screens provide interactivity for a use with the defect source identifier 100 so the defect source identifier 100 can analyze surface features of a desired wafer using prescribed tools and techniques. The GUI screens displayed in FIGS. 3 to 13 may be considered to represent different "states" to allow input of different information, and display different information, relative to the defect source identifier 100. The user of the defect source identifier can navigate between the different GUI screen states as indicated by the embodiment of interaction state diagram 1400 shown in FIG. 14. The interaction state diagram 1400 of FIG. 14 should be viewed in conjunction with the GUI screens described relative to FIGS. 3 to 13. Though the term "screen" is used in many cases in this disclosure to describe the various GUIs, the terms "screens", "GUIs", or "displays" are used interchangeably.

Figure 14A:
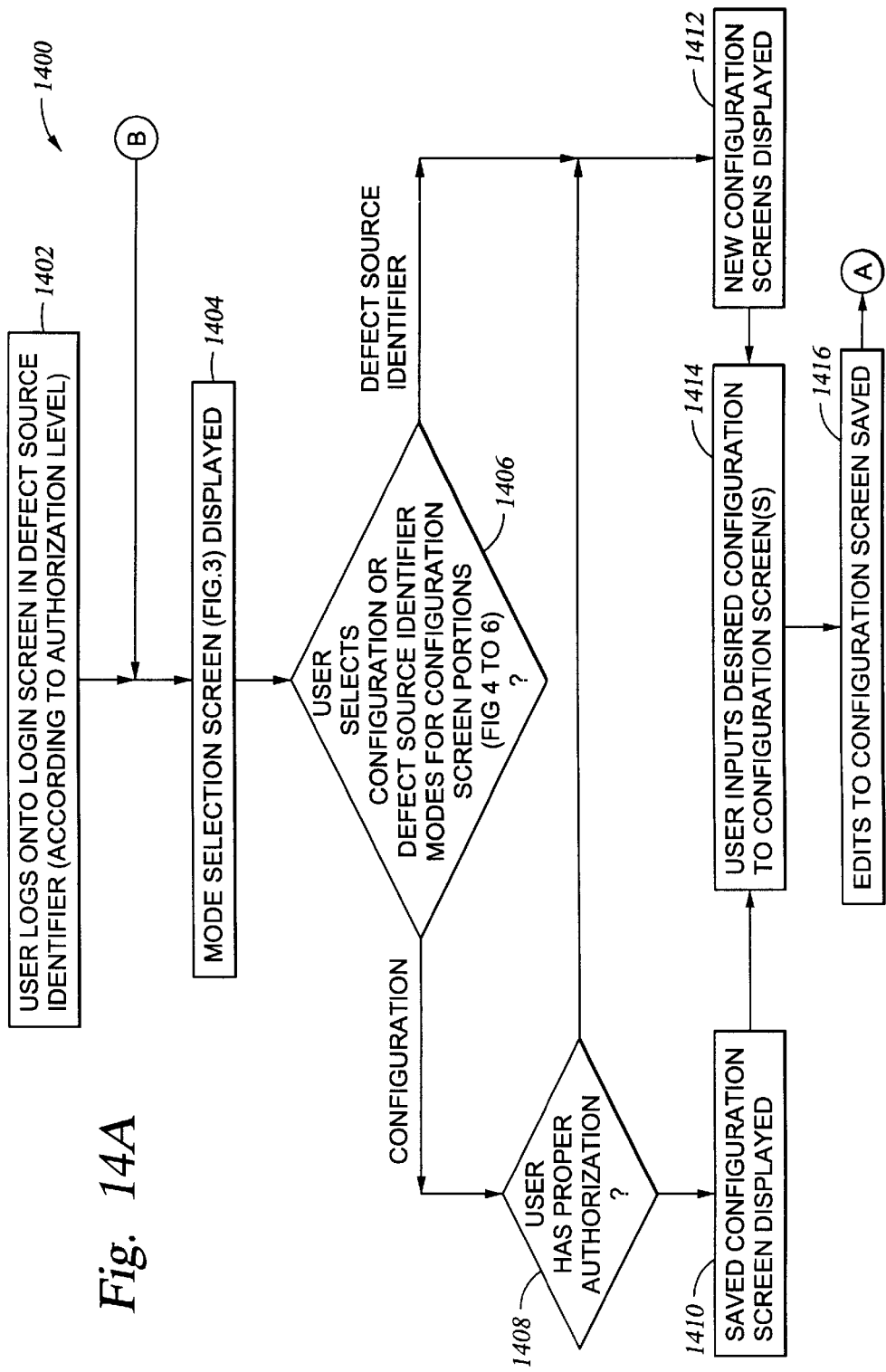
FIG. 14 shows a block diagram of block diagram of the defect source identifier, progressing through the screens shown in FIGS. 3 to 13.
Figure 14B:
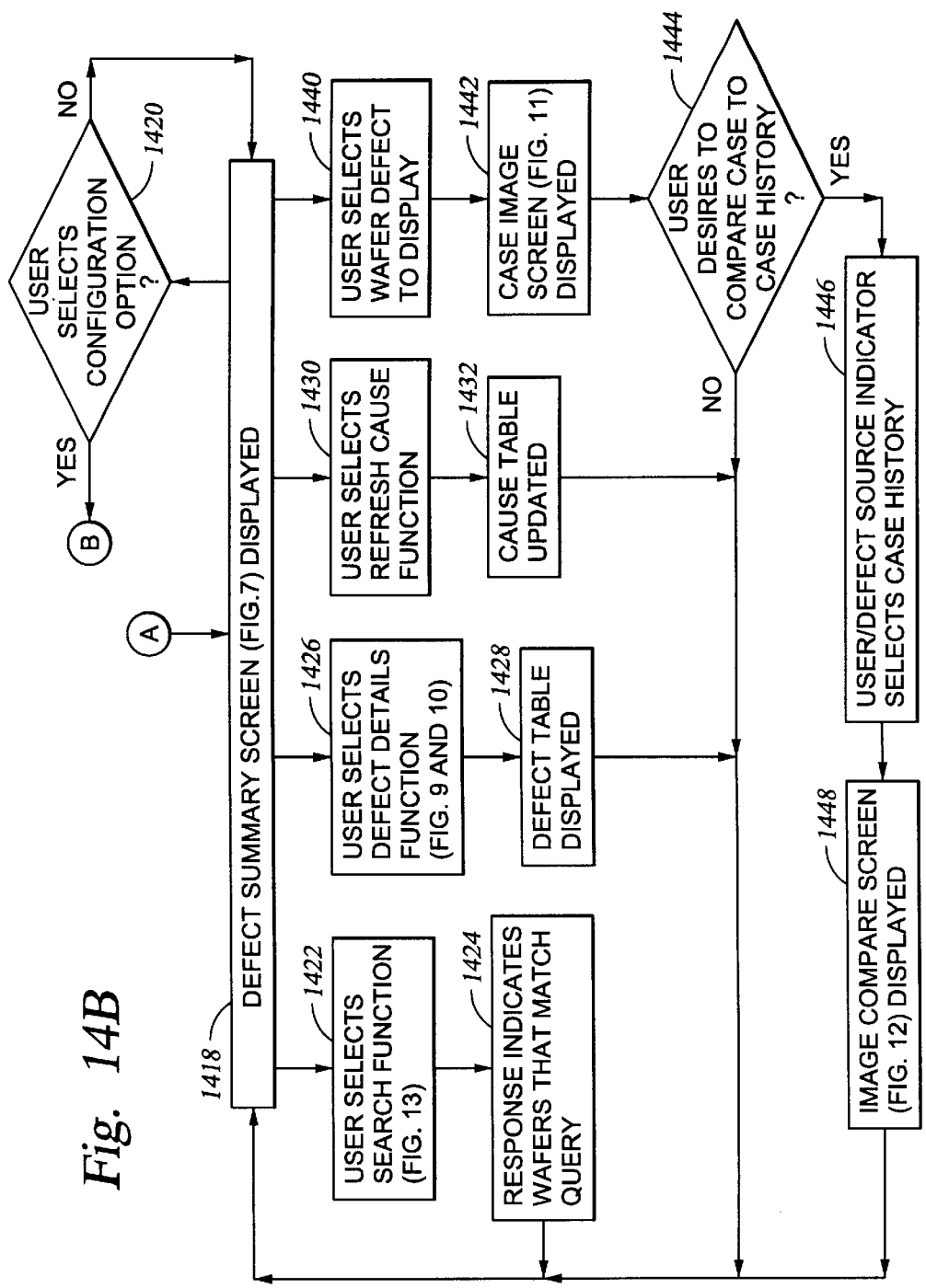

In FIG. 14, a user logs onto the defect source identifier client in step 1402 with a unique user identification and password by entering the information into a login screen (not shown). The user must be authorized to log in before they can access the defect source identifier client 104.

The defect source identifier 100 is preferably provided with its own log in that is distinct from the operating system log in. The distinct defect source identifier relates to the variety of different users having different job requirements and thereby requiring different levels of interactivity. Each user is assigned an account that characterizes a prescribed user authorization level. Differing access levels are provided to different users such as wafer defect inspection process operator, scanning electron microscope process operator, FAB engineer, FAB defect source identifier administrator, yield expert, etc. Once the user is logged in, a mode selection screen is displayed. One embodiment of mode selection screen 300 shown in FIG. 3 contains the processes described in TABLE 1.

TABLE 1

Mode Selection Screen Table Fields

| Name | Description |
| --- | --- |
| Mode Selection Screen | Screen displays the option to either start defect source identifier or edit the configuration |
| Error message | An "Access Denied" error message is displayed if a logon error is encountered |

Figure 3:
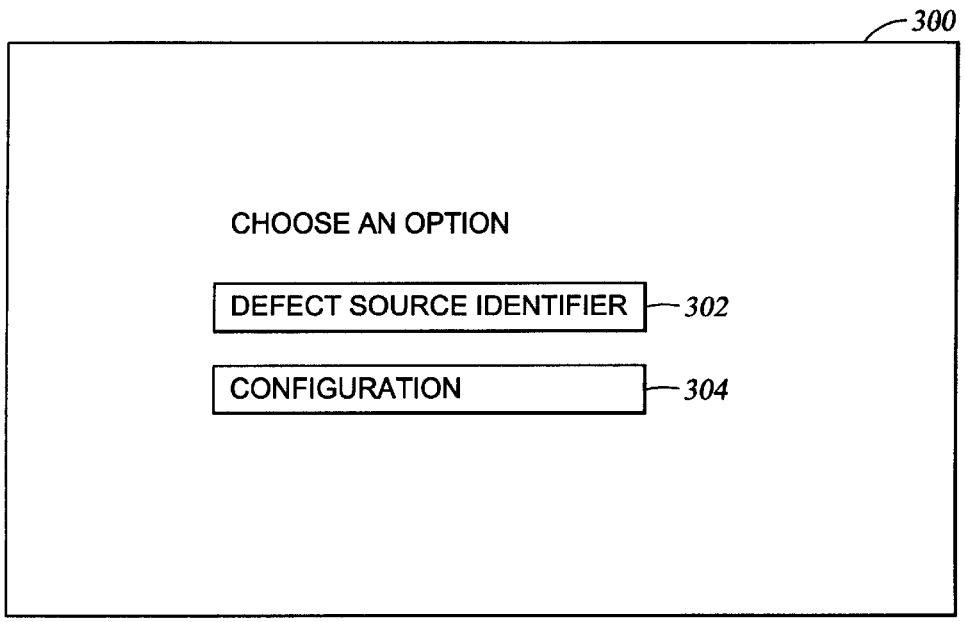
FIG. 3 shows an option screen to be displayed on a display of the defect source identifier.

The embodiment of mode selection screen 300 shown in FIG. 3 is displayed at step 1404 in FIG. 14. The mode selection screen 300 includes the mode fields, in which a user selects either start defect source identifier option or a configuration option as the desired mode. The mode selection screen 300 allows the user to select a configuration option shown in decision step 1406. The user can select a defect source identifier button 302 to start the operation of the defect source identifier 100 in a prescribed system configuration that is typically selected by all new users prior to using the defect source identifier 100. Alternatively, the user selects the configuration button 304 to edit the configuration of the defect source identifier by starting from an existing, e.g., saved, configuration. If the user selects the configuration option in decision step 1406, the method 1400 continues to decision step 1408 in which the defect source identifier 100 determines whether the user has proper authorization to receive an existing saved configuration information that can be displayed or edited by the user. The user can enter a configuration screen (portions of which are shown in FIGS. 4, 5, and 6) by pressing the configuration button 304 in the embodiment of mode selection screen 300 shown in FIG. 3. The configuration button 304 of the mode selection screen will be enabled in step 1408 if the user has the required authorization. If the answer to decision step 1408 is no, the method 1400 continues to step 1412. If the answer to decision step 1408 is yes, the method continues to step 1410 in which the saved configuration screen is displayed on the display screen of the defect source identifier. Following step 1410, the method 1400 continues to step 1414.

If the user selects the start defect source identifier button 302 from decision step 1406 (from the embodiment of mode selection screen 300 of FIG. 3), a new configuration screen (s), one embodiment shown in FIG. 4, 5, or 6 will be displayed. To display a new configuration screen, the initialization function of the configuration screen is performed.

Portions of the configuration screen are shown respectively at 410, 510, and 610 of FIGS. 4, 5, 6. The configuration screen allows the user to select options, in step 1414, that affect the data from the defect source identifier 100 that is displayed to the users. The configuration screen is divided into multiple configuration screen portions in the embodiment shown in FIGS. 4, 5, and 6 as, respectively, configuration screen portions 410, 510, and 610. Each configuration screen portion 410, 510, and 610 displays one or more of the configuration options. If the user wants to change the settings of the configuration options, the user can access and edit the appropriate configuration screen in step 1414 from the embodiment of defect summary screen 702 shown in FIG. 7, or at startup of the defect source identifier client 104.

A station type button 401, a classification criteria button 403, and a display classes button 404 are each positioned on each configuration screen portion 410, 510, and 610 in FIGS. 4 to 6. The buttons allow the user to enter the desired configuration screen portion, when the user is at the state indicated by step 1414 in FIG. 14. Accessing the desired configuration screen portion 410, 510, and 610 allows the user to set the desired respective parameters. A done button 406 is positioned on each configuration screen portion 410, 510, and 610 to close that particular configuration screen portion while saving the updated configuration. The defect source identifier 100 stores the configuration information for each accessed and saved defect source identifier server. A cancel button 408 is positioned on each configuration screen portion 410, 510, and 610 to close that configuration screen portion and cancel any configuration updates. Access to any one of the specific configuration buttons 401, 403, 404, 406, or 408 may be either enabled or disabled depending on the user's level of access.

Selecting the station type button 404, when the user is at the state indicated by step 1414, in each respective configuration screen portion 410, 510, and 610, allows the user to be transferred to the station type configuration screen portion 410 of FIG. 4. Once the station type configuration screen portion 410 is selected in the defect source identifier, the user can select the station type to which the tool (such as the optical wafer defect inspection process 204 or the scanning electron microscope process 206) is connected as the station is to run in near real-time. The select station type display configuration screen portion 410 contains three buttons (e.g., radio buttons) 420, 422, 424 that, when selected, respectively allows the user to select from three respective modes: the wafer defect inspection process mode, the scanning electron microscope process mode, or the off-line (i.e., search) mode. User entry to each of these modes may be regulated according to the access level authorization. The wafer defect inspection process mode and scanning electron microscope process mode allow the user to monitor that specific inspection process being conducted. If the user is using a specific wafer defect inspection process 204 or scanning electron microscope process 206, the defect summary screen of FIG. 7 will update in real-time.

By selecting button 422, the defect summary screen is updated after each wafer is inspected by the scanning electron microscope process. When the defect source identifier 100 is running in wafer defect inspection process mode, the defect summary screen is updated after each lot is inspected. The last wafer inspected in the lot is automatically displayed on the screen and if the user wishes to view any other wafers from the lot, the global search button on the defect summary screen may be used as described below.

Since all stations do not require real-time analysis to be their default mode of operation, those stations can be configured as off-line (search) stations by selecting button 424. Configuring the defect source enables the user to view specific previously inspected wafers. The search mode station and search function on the real-time stations display information from both the wafer defect inspection process and scanning electron microscope process.

Selecting the classification criteria button 403 from any of the configuration screen portions 410, 510, or 610 in respective FIG. 4, 5, or 6 causes the classification criteria screen portion 510, shown in FIG. 5, to be displayed when the method 1400 shown in FIG. 14 is in step 1414. Once the display of the defect source identifier 100 displays the classification criteria screen portion 510, the user can set parameters that determine which defects or wafers are displayed (e.g., all wafers or only wafers that were "flagged" as in excursion cases).

The embodiment of classification criteria configuration screen portion 510, is used to determined the types of defect, the tools to view the defects, and the wafers will be displayed on the defects summary screen (FIG. 7) and also what information will be displayed for the wafers. The user sets the parameters pertaining to adders/repeaters, clusters, spatial signature analysis and excursion in the classification criteria configuration screen portion 510.

Adders/repeaters can be viewed by selecting box 524 and then selecting either the adders button 520, the repeaters button 522 or both. The adders option selected by selecting radio button 520 causes the system 100 to calculate and display the defects that were detected by the tool that most recently inspected the wafer. The repeaters option selected by selecting radio button 522 causes the system to calculate and display the defects that are repeated throughout a plurality of wafers. If neither the adders nor repeaters options are selected, then a default all defects are displayed on the defect summary screen.

The cluster option, activated by selecting check box 525, identifies clusters of defects on a wafer. On the defect summary screen, the clusters of defects are highlighted on the wafer map and cluster IDs (CIDs) are displayed in the defects table 706 of the embodiment of defect summary screen 702 shown in FIG. 7.

Clustering may be performed by the wafer defect inspection process tool if a wafer defect inspection process radio button 526 is selected or by the defect management database process 208 if a defect management database process radio button 528 is selected. The user can configure the defect source identifier 100 to use either one of the clustering methods. Selecting the cluster configuration option on the embodiment of defect summary screen shown in FIG. 7, will indicate that the clusters are 'calculated' in the display options table 706 of the embodiment of defect summary screen 702. When the cluster option is not selected, the display options in the defect summary screen will provide a suitable indication. If an error occurs calculating the clusters, an error icon will be displayed on the defects summary screen and the error will be logged on the error message page.

The spatial signature analysis option is selected if a spatial signature analysis check box 530 is selected. The spatial signature analysis calculation is performed by the defect management database process 208. The spatial signature analysis calculates and displays the spatial signature analysis result in the defects table 706 of the defect summary screen 702. If the defect management database process 208 is not available, the spatial signature analysis information will not be displayed.

When the embodiment of defect summary screen 702 shown in FIG. 7 is displayed, the display options will read 'calculated' if the spatial signature option was selected. When the spatial signature analysis option is not selected, the display options will provide a suitable indication. If an error occurs calculating the spatial signature analysis result, an error icon will be displayed on the defects summary screen 702 and the error will be logged on an error message page.

Selecting the excursion check box 532 of the classification criteria configuration screen 510 executes an excursion option that gives the user the ability to display wafers that exceed the excursion criteria. Selecting the excursion option means that not all wafers will be displayed in real-time but only, e.g., problematic wafers.

Selecting the display classes button 404 on any configuration screen portion 410, 510, or 610 causes the display classes screen portion 610 (one embodiment of which is shown in FIG. 6) to be displayed, when the user is at the state indicated by step 1414 in FIG. 14. Selecting the options on the display classes screen allows the user to select which classes are to be displayed. Selecting the done button 406 saves the configuration and performs an initialization function. Selecting the cancel button 408 cancels the configuration changes and returns the display of the defect source identifier to the previously displayed screen, e.g., the mode selection screen or the defect summary screen.

The on-the-fly (OTF) classes of the wafer defect inspection process are pre-defined. Therefore, the user may select classes to view by checking one or more of the class boxes 612. Specific re-visit classes 614 as well as specific scanning electron microscope-automated defect classification classes 616 are configurable by each customer. The user selects the classes of interest (highlights them) and then selects or deselects the classes using list shift buttons 618 or 620. The defect source identifier 100 only displays the user-selected classes, i.e., those classes appearing in the "selected" lists 622 and 624 as opposed to the "unselected" lists 626 and 628.

Once the user has completed altering the information contained in any of the configuration screen portions 410, 510, and/or 610, he/she selects the done button 406 of the configuration screen shown in FIGS. 4 to 6 to save the edited configuration as shown in decision step 1416 in FIG. 14.

Following saving the edited configuration screen(s), the initialize function for the defect summary screen 702 shown in FIG. 7 is displayed.

If the user wants to cancel the configuration changes, he/she selects the cancel button 408 of the configuration screen shown in FIGS. 4 to 6 to return to the mode selection screen or the defect summary screen.

For all configured station types, the defect summary screen 702 of the embodiment shown in FIG. 7 is subdivided into four tables including: a general information table 704, a defects table 706, a causes table 708, and a processing tools selection list table 710. The top portion 700 of the screen comprises conventional browser control menus. The user inputs to the defect summary screen 702 are described relative to step 1418 in FIG. 14.

The left side of the general information table 704 of the defect summary screen 702 contains such information as the layer, lot and wafer identification and the number of defects of the wafer currently viewed. A defect wafer map graphic 712 occupies the center of this section and shows the location of the defects 713. The right side of the general information section contains the status of the classification options 714 as selected in the configuration screen, as well as a configuration button 720 and a search button 722. The configuration button allows the user to execute decision step 1420 in FIG. 14 to access the configuration screen portions 410, 510, 610 shown respectively in FIGS. 4, 5, and 6 to make alterations to the status of the defect summary screen 702. A global search function is selected by pressing the search button 722. The global search function causes the method 1400 to proceed step 1422. At step 1422, the method invokes a search method and the user is promoted to enter search criteria. See FIG. 13 and the associated description below for a discussion of the search screen. From step 1422, the defect source identifier 100 proceeds to step 1424 wherein the method 1400 searches for wafers that match the search query provided by the user. Following step 1424, the defect source identifier displays the defect summary screen for a previously processed wafer that meets the search criteria.

The defects table 706 contains information on the classification of the wafer defects. The user selecting the defects details button 726 invokes the defect detail function of step 1426 in FIG. 14. Step 1426 extends the number of rows included in the defects table 706 to include more information such as the precise location and size of the defects. From step 1426, the method 1400 continues to step 1428 in which the displayed defect table 706 is expanded. The method 1400 then returns to step 1418. The fields contained in the non-expanded defects table 706 are shown in TABLE 1, and depend on the configured station type.

TABLE 1

Standard Fields In Defects Table Of Defect Summary Screen

| Wafer defect inspection process station | Scanning electron microscope process station | Search Station |
|---|---|---|
| Defect # | Defect # | Defect # |
| On-the-fly | On-the-fly | On-the-fly |
| Spatial signature analysis | Spatial signature analysis | spatial signature analysis |
| Revisit | Revisit | Revisit |
| Cause | Scanning electron microscope-automated defect classification | Scanning electron microscope-automated defect classification |

TABLE 1-continued

Standard Fields In Defects Table Of Defect Summary Screen

| Wafer defect inspection process station | Scanning electron microscope process station | Search Station |
|---|---|---|
| CID | Cause<br>EDX (SEM)<br>CID (wafer defect inspection process) | Cause<br>EDX (SEM)<br>CID (wafer defect inspection process) |

When the user selects the defect details function by, e.g., selecting the defect details button 726 in the embodiment of defect summary screen 702 shown in FIG. 7, the expanded information contained in TABLE 2 is displayed in the defects table 706:

TABLE 2

Expanded Fields In Defects Table Of Defect Summary Screen

| Wafer defect inspection process | Scanning electron microscope process | Search Data |
|---|---|---|
| Defect # | Defect # | Defect # |
| On-the-fly | On-the-fly | On-the-fly |
| Spatial signature analysis | Spatial signature analysis | spatial signature analysis |
| Revisit | Revisit | Revisit |
| Cause | Scanning electron microscope-automated defect classification | Scanning electron microscope-automated defect classification |
| CID | Cause | Cause |
| X Location | EDX (SEM) | EDX (SEM) |
| Y Location | CID | CID |
| X Die | X Location | X Location |
| Y Die | Y Location | Y Location |
| X Size | X Die | X Die |
| Y Size | Y Die | Y Die |
| Defect Area | X Size | X Size |
| Volume | Y Size | Y Size |
| Grade | Defect area (wafer defect inspection process) | Defect area (wafer defect inspection process) |
| Type | Volume (wafer defect inspection process) | Volume (wafer defect inspection process) |
| CID | Grade (wafer defect inspection process)<br>Type (wafer defect inspection process) | Grade (wafer defect inspection process)<br>Type (wafer defect inspection process) |

A description of fields appearing on the embodiment of defect table 706 in the embodiment shown in FIG. 7 are shown in TABLE 3.

TABLE 3

Description Of Defect Summary Screen Fields

| Column Title | Field Description |
|---|---|
| Defect # | Sequential number for each defect detected on the wafer. |
| On-the-fly | On-the-fly classification performed on all defects by the wafer defect inspection process tool. |

TABLE 3-continued

Description Of Defect Summary Screen Fields

| Column Title | Field Description |
| --- | --- |
| Spatial signature analysis | Spatial signature analysis classification. This column is populated only if the spatial signature analysis option is selected in the configuration screen |
| Revisit | The additional classification of certain defects that were reviewed with an optical microscope. |
| Scanning electron microscope-automated defect classification | The additional classification of certain defects that were reviewed with the scanning electron microscope process. These defects are a subset of the defects subset of the defects already classified by the re-visit review or others that are selected for review by the scanning electron microscope process. |
| Cause | Displays possible causes for the defect based on the historical case studies. The name of a case is displayed if only one matching case is found. If more than one matching case is found, a number is displayed indicating the number of cases found. A class may not have any associated case studies in which case 'Unknown' is displayed. |
| X Location | The precise X location of the defect on the die of the wafer. |
| Y Location | The precise Y location of the defect on the die of the wafer. |
| X Die | The X location of the die containing the defect. |
| Y Die | The Y location of the die containing the defect. |
| X Size | The width of the defect. |
| Y Size | The height of the defect. |
| Defect Area | The area occupied by the defect. This calculated by multiplying X Size and Y Size. |
| CID | Displays a cluster identification for each clustered defect. If defects are close together, they will have the same cluster ID. This column is populated only if the cluster option is selected in the configuration. |
| EDX | |

The causes table 708 in the embodiment of defect summary table 702 of FIG. 7 reflects case study information from the defect source identifier. Within the causes table 708, a user can select a refresh causes button 709 to invoke step 1430. Pressing the refresh causes button 709 will automatically update the causes table 708 at step 1432 and the causes column 730 of the defects table 706. Following step 1432, the method 1400 returns to step 1418. The refresh causes button 709 helps identify which tools may be responsible for any particular defects.

The causes table 708 displays the various classes of defects in a class column 732 shown in TABLE 4 with the number of defects of each class on the current wafer, and the possible causes for the defects.

TABLE 4

Causes Table Fields

| Column Title | Field Description |
| --- | --- |
| Class | A class of defects |
| # of Defects | The number defects of the particular class appearing on the wafer currently being processed. |
| Possible Causes | A list of the possible causes of the defect for the class of defects. |

Causes can be ordered in the causes table 708 in alphabetical order, or in any other desired order. For example spatial signature analysis classes can be displayed first then scanning electron microscope-automated defect classification, re-visit, and on-the-fly classes are displayed.

The on-the-fly classes may be pre-configured. The scanning electron microscope-automated defect classification and revisit classes are configurable. Each user will have their own set of scanning electron microscope-automatic defect classification and revisit classes. The defect source identifier 100 uses a map file to translate the customer's scanning electron microscope-automatic defect classification and revisit classes that the defect knowledge database process will recognize. A customer's classes will exist in their particular customer knowledge database process 218 if one exists.

KLA files that are generated from on-the-fly are displayed distinctly from KLA files that are generated by revisit classes. The KLA files have separate columns in the defect section for on-the-fly and re-visit classes. The wafer defect inspection process will generate the file once it has finished all testing on the lot so that both on-the-fly and revisit results can be stored within one file.

The processing tools table 710 in the defect summary screen 702 includes a list of processing tools that the wafer identified in portion 704 was processed with since the last inspection. The tools can be selected to view case studies that apply to a specific defect or a class of defects caused by the tools selected. This helps the user identify which tools may be responsible for the defects. By default, the tools are listed in reverse processing order, from the last tool to process the wafer to the first. Selecting a small tools arrow button 736, located next to the processing tools table 710 title, reverses the order of the tools and displays them in processing order. Any case studies that are relevant for each of the defects on the wafer indicate one specific responsible processing tool that will be highlighted on the screen. The processing tool table fields are shown in TABLE 5.

TABLE 5

Processing Tool Configuration Data Fields

| Parameter Name | Description |
| --- | --- |
| Station Type/Station ID | The station type is wafer defect inspection process, scanning electron |

TABLE 5-continued

Processing Tool Configuration Data Fields

| Parameter Name | Description |
| --- | --- |
|  | microscope process, or off-line (search). If the type is either of the first two, a Station identification will be required |
| Adders/Repeaters | Field stating whether adder, repeaters or all defects should be displayed |
| Cluster | Field stating whether cluster IDs should be displayed and from where the cluster data is gathered |
| spatial signature analysis | Field stating whether the spatial signature analysis should be calculated for distribution on the wafer |
| Excursion | Fields indicating whether all wafers with defects will be displayed or only wafers that exceeded the excursion limit. |
| On-the-fly classes | Fields specifying which on the fly classes should be displayed on the defects summary screen |
| Revisit classes | List specifying which revisit classes the user wishes to view |
| scanning electron microscope process classes | List specifying which scanning electron microscope-automated defect classification classes the user wishes to view |

Once the initialization process has completed, the defect source identifier 100 will execute the defect source identifier database process 214 to determine the last wafer processed by the tool. The defect source identifier 100 executes the manufacturing execution database process 210 to retrieve a sequential list of processing tools that processed the wafer. If any of the adders, repeaters, spatial signature analysis or clusters from the defect management database process 208 have been configured, the defect source identifier 100 accesses the defect management database process 208 to retrieve the configured information.

The defect source identifier 100 then executes the defect knowledge database process 216 to obtain a list of causes for each detected defect. This list of causes is based on either all of the defect's classifications or the configured classifications for a specific defect. The defect source identifier 100 also executes the defect knowledge database process 216 to get a list of causes for each selected defect classification and populates the fields of the causes table 708 of the defect summary screen 702.

After the data collection is complete, the defect summary screen 702 is displayed. If the defect source identifier 100 cannot access data for any one of the data collection points described above, an error message is displayed to the user.

In addition to modifications of the displayed defect summary screen 702 using, e.g., the configuration function or the search function. Through the defects details function (steps 1426 and 1428), or the refresh causes function (steps 1430 and 1432), the user can cause various defect images to be displayed. The user can select any defects on the wafer map 712 shown in FIG. 7 by, e.g., a mouse select at a suitable location on the wafer map or an alphanumeric selection where each defect is provided a referencing number or letter, to highlight the corresponding defect record on the defects table.

The user can select on a particular defect number in a defect # column 740 on the defects table of the defect summary screen 702 to highlight the corresponding defect on the defect map. The row corresponding to the selected defect displays a gallery of images for that defect. To sort the defects table, an arrow is located beside the titles of some of the fields in the defect summary screen 702. The user selects the arrow beside the field stating the criterion used to sort the table. The defects details associated with the selected defect field are displayed. The user can display additional detail for each defect on the defects table 706 by selecting the defects details button 726. The size and location of certain defects are derived if the defect was reviewed, e.g., from information generated by the scanning electron microscope process.

The user can select any class in the cause column 730 of the defects table 706 to select that class and the rows in the defects table 706 and defects on the wafer map 712 that relate to the selected class will be displayed. If an error occurs during the execution of any of the above functions, the execution of the function will be terminated and the original defect data will be displayed. An error icon will appear on the defect summary screen and the error will be logged on the error message page.

The defect summary screen 702 displays data from various data sources. The inspection tools of the defect source identifier creates a KLA file after they are done inspecting a lot or wafer and store wafer identification and defect inspection information in this file. The general information section 704 of the defect summary screen 702 is populated with layer, wafer, and lot IDs gathered from the KLA result file. The display options table 714 is populated with the information from the configuration settings.

The defects table section 706 contains data that was collected by the metrology tools, e.g. the scanning electron microscope process 206 and the wafer defect inspection process 204. Depending on the station the user is running the defect source identifier from, data from the wafer defect inspection process 204 only, the scanning electron microscope process only if data from the wafer defect inspection process is unavailable, or both processes 204, 206 will be displayed in the defects table section 706. The KLA file produced by each wafer defect inspection tool contains the information to populate the fields shown in TABLE 6:

TABLE 6

Defect Table Fields Of The Defect Summary Screen

| Column Title | Field Description |
| --- | --- |
| Defect # | Sequential number for each defect detected on the wafer |

TABLE 6-continued

Defect Table Fields Of The Defect Summary Screen

| Column Title | Field Description |
| --- | --- |
| On-the-fly | On-the-fly classification performed on all defects by the wafer defect inspection process tool. |
| Revisit | The additional classification of certain defects that were sent to be reviewed with an optical microscope. |
| Scanning electron microscope-automated defect classification | The additional classification of certain defects that were sent to be reviewed with the scanning electron microscope process. These defects are a subset of the defects already classified by the re-visit review or others that are selected for review with the scanning electron microscope process. |
| X Location | The precise X location of the defect on the die of the wafer. |
| Y Location | The precise Y location of the defect on the die of the wafer. |
| X Die | The X location of the die containing the defect |
| Y Die | The Y location of the die containing the defect. |
| X Size | The width of the defect. |
| Y Size | The height of the defect. |
| Defect Area | The area occupied by the defect. This calculated by multiplying X Size and Y Size. |

The cause column 730 in the defects table 706 is based on data retrieved from the defect knowledge database process and the customer knowledge database process with the data from the metrology tools 204, 206 for each defect detected on the wafer. The defect source identifier finds the relevant case histories for each defect by correlating the following search criteria that was input into these systems using on-the-fly, spatial signature analysis, re-visit and scanning electron microscope-automated defect classification classes, and one or more processing tools.

The spatial signature analysis data is retrieved from the defect management database process 208. The spatial signature analysis data is gathered if the spatial signature analysis option 530 is selected in the select defect classification criteria configuration screen portion 510. The cluster data (CID) is gathered from the defect management database process 208 or KLA file depending on the configuration. If the spatial signature analysis or cluster information cannot be retrieved from the defect management database process 208, then the defects summary screen will be displayed without the information.

The causes table 708 of the defect summary screen 702 contains data retrieved from the KLA file, the defect knowledge database process 216 and the customer knowledge database process 218. If the defect source identifier 100 cannot access the defect knowledge database process 216, the defects summary screen is displayed without any causes information. Each defect classification listed in the defects table (which includes input from one or many KLA files) is used to look up the case studies in defect knowledge database process 216. The inputs into the defect knowledge database process 216 to retrieve the cases are tool type and on the fly, spatial signature analysis, re-visit and scanning electron microscope-automated defect classifications.

Accessing the manufacturing execution database process 210 populates the fields of the processing tools table as shown in TABLE 7. If the tool (e.g., scanning electron microscope process 206 or wafer defect inspection process 204) information cannot be retrieved for a wafer identification or a lot identification, the defect inspection information for the wafer will not be displayed.

TABLE 7

Output For Defect Summary Screen

| Names | Description |
| --- | --- |
| Defects Summary screen | The Defects Summary Screen for the selected mode is displayed containing the defect inspection information for the wafer. |
| Error message | A detailed error message is displayed in the error message page if an error is encountered. |

A user can select an image selection button 742 in the defect # column 740 in the defects table 706 to display an image selection screen including a gallery of images for that defect. Once the image button 742 has been selected, defect source identifier accesses the defect source identifier database to retrieve the image file name(s) for the specific defect with respective input and output fields as shown respectively in TABLES 8 and 9.

TABLE 8

Input Fields For Image Selection Screen

| Name | Description |
| --- | --- |
| Layer ID | The layer identification of the wafer |
| Lot ID | The lot identification of the wafer |
| Wafer ID | The wafer identification of the wafer |
| Defect # | The unique number of the defect on the water |

The image file(s) are exported by the defect source identifier along with the KLA file and stored in the defect source identifier file system. In one embodiment, the wafer defect inspection process 204 and the scanning electron microscope process 206 generate an image file for each KLA file. The image files may contain all the images for the lot or wafer. If an error occurs locating or retrieving the images, on the error message page. The error may also be stored in an error log file database.

TABLE 9

Output Fields For Image Selection Screen

| Name | Description |
| --- | --- |
| Defect Image Screen | A new web browser containing the images, a wafer map with the selected defect highlighted, defect #, and layer, lot and wafer IDs |

TABLE 9-continued

Output Fields For Image Selection Screen

| Name | Description |
| --- | --- |
| Error message | A detailed error message is displayed in the error message page if an error is encountered. |

The user can select the wafer defect to display as illustrated in step 1440 of FIG. 14. In the cause column 730 of the defects table 706, the name of a cause of a defect is displayed only if a matching cause is found. If more than one matching cause is found, the number of causes found is displayed. The user can click on the number to open a new browser window displaying a defect cause selection screen 900 (one embodiment of which is shown in FIG. 9) listing the various cause names in field column 902, cause descriptions in filed column 904 and case images in field column 906 that have historically been found to apply to that specific defect. The user can then click on any name in the cause column 902 to display a detailed case description 1000 of FIG. 10.

When the user clicks on a case image button 908 in the case images column 906, a new browser opens (corresponding to step 1442 in FIG. 14) displaying a case image screen 1100 corresponding to images 1102, 1104, 1106 associated with the selected case study. The embodiment of case image screen 1100 shown in FIG. 11 is based on the assumption that the case studies in defect knowledge database process are organized so the defect source identifier 100 can retrieve images generated by the scanning electron microscope process 206, the wafer defect inspection process 204 and other such processes. The fields associated to the expanded defect cause selection screen of FIG. 9 are shown in TABLE 10.

TABLE 10

Input Fields To Expanded Defect Cause Selection Screen

| Name | Description |
| --- | --- |
| Layer ID | The layer identification of the wafer |
| Lot ID | The lot identification of the wafer |
| Wafer ID | The wafer identification of the wafer |
| Class | The defect classifications |
| Tool(s) | The tools for which the causes are to be listed |

The case image screen 1100 of FIG. 11 may access the different screens shown in TABLE 11. If an error occurs displaying any of the case image screens 1100, the defects summary screen will be redisplayed and an error message will be displayed on the error message page and logged in the error lot file.

TABLE 11

Outputs From The Defect Cause Selection Screen

| Name | Description |
| --- | --- |
| Possible Causes List Screen | A new browser displaying the Causes List table |

TABLE 11-continued

Outputs From The Defect Cause Selection Screen

| Name | Description |
| --- | --- |
| Defect Knowledge Database Process Defect Details Screen | A new screen is displayed showing the case background, case details, and defect information, all retrieved from the Defect Knowledge Database Process |
| Case Images Screen | A new browser is displayed showing the Defect Knowledge Database Process images for a specific case |
| Error message | A detailed error message is displayed in the error message page if an error is encountered |

The user can select to compare an image displayed in the case image screen 1100 with a wafer defect case history retrieved by the customer knowledge database process 218 and/or the defect knowledge database process 216 as indicated by steps 1444 and 1446 of FIG. 14. First, the user selects whether they wish to utilize an image compare screen 1200 as shown in FIG. 12 in decision step 1444. If the answer to decision step 1444 is no, then the method 1400 returns to step 1418. If the answer to decision step 1444 is yes, the method 1400 continues to step 1446 wherein the user selects the particular case history and metrology tool process 204 or 206 to display in the image compare screen 1200.

The method 1400 displays an image compare screen 1200 of FIG. 12 (step 1448), that allows the user to compare a defect image selected from a defect image screen 800 including fields shown in TABLE 12. The embodiment of defect image screen 800 shown in FIG. 8 displays a plurality of case images including images sets 802, 804, 806 from such tools as the scanning electron microscope process 206 and/or the optical wafer defect inspection database process 204 similar to as displayed on the case image screen 1100 shown in FIG. 11. The user may selects one image from each of the types of processes 204 and/or 206 or other.

TABLE 12

Inputs To Image Compare Screen

| Name | Description |
| --- | --- |
| Defect Image Name | The name of the image selected from the Defect Image screen |
| Case Image Name | The name of the image selected from the Case Image screen |
| Layer ID | The layer identification of the wafer |
| Lot ID | The lot identification of the wafer |
| Wafer ID | The wafer identification of the wafer |
| Case description | The case study name that references the image to be enlarged |

The user selects an image in either the case image screen 1100 or the defect image screen 800 and a new browser window displaying the image compare screen 1200 is launched with an enlarged version of the image 1202 selected. The user can then select an image from the case image screen 1100 and an enlarged version of the image 1204 will be displayed adjacent to the previous image selected.

The user can select any of the possible causes included in the causes table 708 of the defect summary screen 702 to display a new possible cause selection browser window containing detailed information about the specific case from the defect source identifier. The inputs to the possible cause selection screen is shown in TABLE 13.

TABLE 13

Inputs To The Possible Cause Selection

| Name | Description |
| --- | --- |
| Layer ID | The layer identification of the wafer |
| Lot ID | The lot of identification of the wafer |
| Wafer ID | The wafer identification of the wafer |
| Class | Defect classification |
| Tool(s) | The tools for which the causes are to be listed |

When the user selects a specific cause name in the causes table 708 of the defect summary screen 702, the case study details are retrieved by the defect knowledge database process and a new browser window containing the detailed information is displayed. The outputs from the possible cause selection table is shown in TABLE 14.

If an error occurs displaying the detailed cause selection screen, the defects summary screen 700 will be redisplayed and an error message will be displayed on an error message page and logged in the error log file database.

TABLE 14

Outputs From The Possible Cause Selection

| Name | Description |
| --- | --- |
| Defect Knowledge Database Process Defect Details Screen | A new browser is displayed showing the case background, case details, and defect information, all retrieved from the Defect Knowledge Database Process. |
| Error Message | A detailed error message is displayed in the error message page if an error is encountered |

Each wafer undergoing processing is sequentially processed by a plurality of processing tools. Processing of the wafer by any of these processing tools may cause certain defects on the wafer. A list of the processing tools that have processed a wafer is provided in the processing tool table 710 located at the bottom of one embodiment of the defect summary screen 702 in FIG. 7. The user can select one or more of these processing tools and click the refresh causes button 709 to refresh the defects table 706 and the causes table 708. The refreshed defects table 706 summarize the causes that may apply to each processing tool used to process the particular wafer. By default, the causes table 708 shows all possible causes for the wafer's defects. The inputs to the processing tool includes the fields shown in TABLE 15.

TABLE 15

Inputs To The Processing Tool Table

| Name | Description |
| --- | --- |
| Layer ID | The layer identification of the wafer |
| Lot ID | The lot identification of the wafer |
| Wafer ID | The wafer identification of the wafer |
| Class | Defect classification |

Once the user selects the desired tools and selects the refresh causes button 709, information is retrieved by the defect knowledge database process and the defects and causes table 708 are updated to show the defects present on the wafer during the processing involving the selected tools. The outputs from the processing tool includes those fields shown in TABLE 16.

TABLE 16

Outputs From The Processing Tool Section

| Name | Description |
| --- | --- |
| Cause column of the Defects Table | Updated to show the cause or number of causes for the defects during the processing of the selected tool(s) |
| # of Defects column of the Causes Table | Updated to show the number of defects present during the processing of the selected tool(s) |
| Possible causes | Updated to show the cases pertaining to the selected tool(s) |

A global search button 722 is located to the right of the wafer map 712 in the embodiment of defect summary screen 702 shown in FIG. 7. This global search button 722 allows the users to display defect inspection information for a specific wafer using a wafer search screen 1300 shown in FIG. 13. The global search button 722 allows the users of search stations in the wafer search screen 1300 to display the defect information for a specific wafer on the existing browser as indicated in steps 1422 and 1424 of FIG. 14, which is not updated in real-time. The user can specify various parameters in the wafer search screen 1300 to narrow the search. If multiple wafers match the search criteria, a list of matching wafers will be displayed for the user. The user selects a specific wafer for display in the defect summary screen 702.

The user will enter in the wafer search screen 1300 the date/time ranges of wafers in fields 1302A, 1302B, 1302C and 1302D. In fields 1304A and 1304B, the inspection/review tool of interest and a processing tool of interest in fields 1306A and 1306B. The user also has the option of retrieving a list of wafers that are in excursion by selecting excursion check field 1308 or all wafers that match the above filters by not selecting excursion check field 1308. After the filter fields are complete, the user selects a find wafers button 1310 to retrieve the list of wafer lots matching the selected filter criteria.

The user then selects a specific lot of interest by selected a lot identification option in a lot identification pull-down menu 1314. The list of wafers is then populated with wafer IDs in a wafer identification field that are contained in the selected lot in a wafer identification pull-down menu 1312. The user then selects the wafer of interest. The list of layer IDs is then populated by selecting one wafer identification option in the wafer identification pull-down menu 1312, then the layer identification pull down menu 1316 is populated.

Once all the selections are complete, the user selects a complete button 1320 to retrieve the analysis data and to display the results in the defect summary screen 702 shown in FIG. 7.

The global wafer search table includes those fields shown in TABLE 17.

TABLE 17

Inputs To The Global Wafer Search Table

| Name | Description |
|---|---|
| Layer ID | The layer identification of the wafer being searched |
| Lot ID | The lot identification of the wafer being searched |
| Wafer ID | The wafer identification of the wafer being searched |
| Excursion | Search for wafers in excursion |
| Inspection Tool Type and ID | Search wafers inspected by a specific inspection tools |
| Processing Tool Type and ID | Search wafers processed by a specific processing |
| Search Date, Start Time | Search wafers in a specified time period |
| End Data, End Time | Search wafers in a specified time period |

Error Handling

The defect source identifier has error handling capabilities that display errors and informational messages to the user using a message page. The errors are displayed to the user in an error message screen and the error details are logged in a log file database. Each error message in the log file database includes a date/timestamp.

If the defect source identifier can't access tool information using the manufacturing execution database process 210 for a specific lot due to errors accessing them, the lot of wafers will not be displayed. The errors will be displayed on the error message page and logged in the error log file database. The wafer search screen 1300 may then be displayed instead of the defect summary screen 702.

If the defect source identifier is unable to access case information using the defect knowledge database process 216 due to accessing errors, the defect summary screen will be displayed without the case information. The error will be displayed on the error message page and logged in the error log file database.

If the defect source identifier 100 is unable to access adders, repeaters, spatial signature analysis or cluster information from the defect management database process 208, the defect summary screen is displayed without this information. The error will be displayed on the error message page and logged in the error log file database. If the defect source identifier is unable to access the defect source identifier historical database, this error will be displayed on the error message page and logged in the error log file database. The defect source identifier will thereupon exit.

Client-Server Architecture

Figure 16:
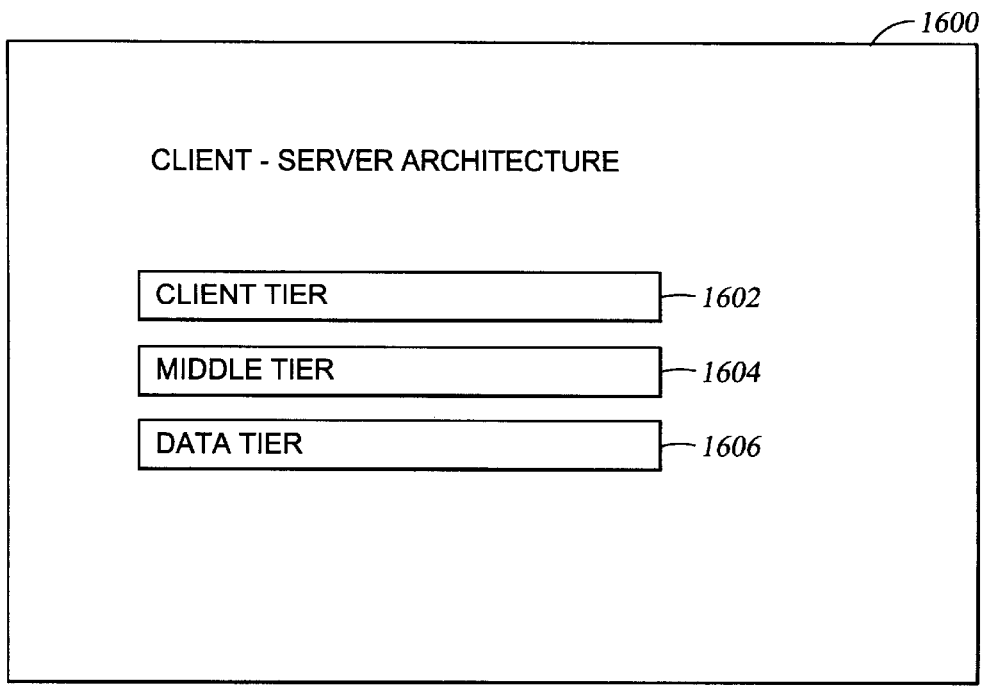
FIG. 16 shows a multi-level client server architecture of one embodiment of defect source identifier.

The embodiment of defect source identifier 100 shown in FIG. 16 has a three tiered client-server architecture 1600 including a client tier 1602, a middle tier 1604, and a data tier 1606. The client tier 1602 provides user interfaces for defect source identifier. In one embodiment, the client tier consists of browser software commonly utilized to provide an Internet connection to client computers 105 located at the defect source identifier client 104.

One embodiment of the middle tier comprises MICROSOFT® Internet Information Server and MICROSOFT® Transaction Server. The middle tier implements the business rules for the client application, manages transactions with the database processes 210, 212, 214, 216, 218, and 220, and serves web pages to the browser clients. The middle tier processes resides on the defect source identifier server 106. One embodiment of the middle tier processes comprise, e.g., a WINDOWS NT® server, a SQL server database, and the defect knowledge database process 216. The middle tier processes may interact with databases and other data source products that reside on other servers that are typically operated outside the scope of the defect source identifier 100.

One embodiment of the data tier consists of a SQL database server that includes the defect source identifier database process 214 and the defect knowledge database process 216. The data tier also consists of manufacturing execution database process 210, a defect management database process 208 and the customer knowledge database process 218.

Figure 15A:
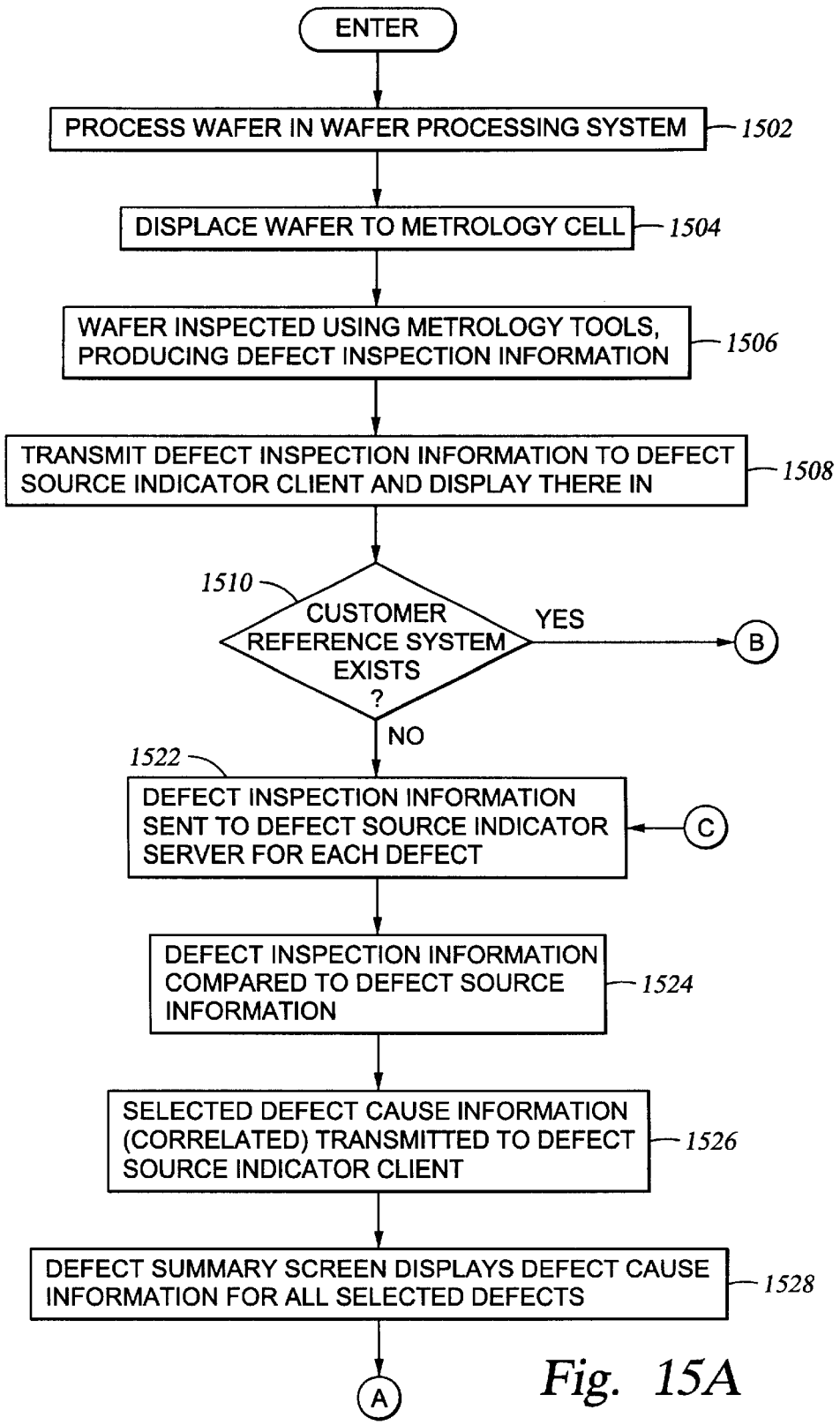
FIG. 15 shows a defect detection method performed by the defect source identifier shown in FIG. 1.
Figure 15B:
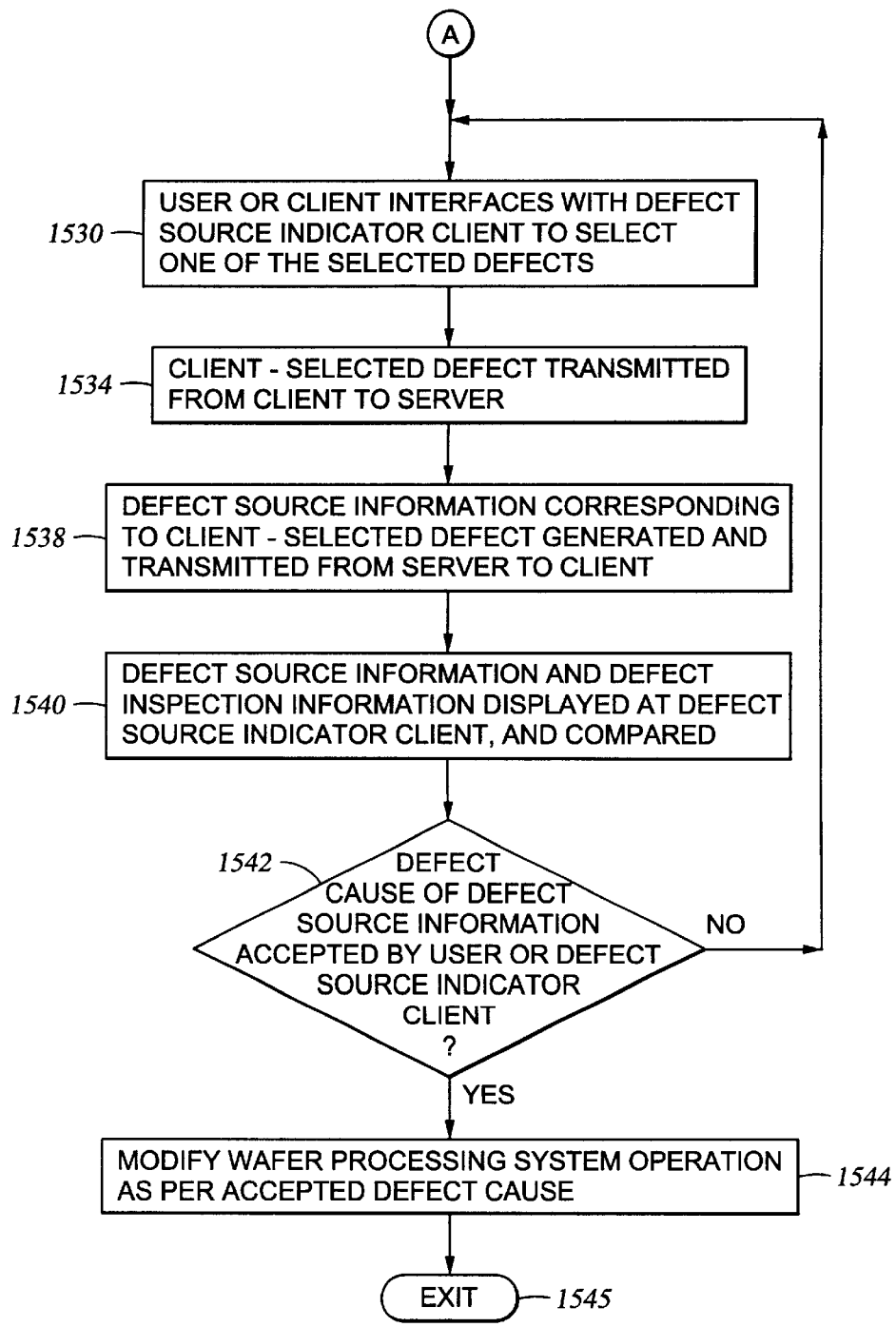
Figure 15C:
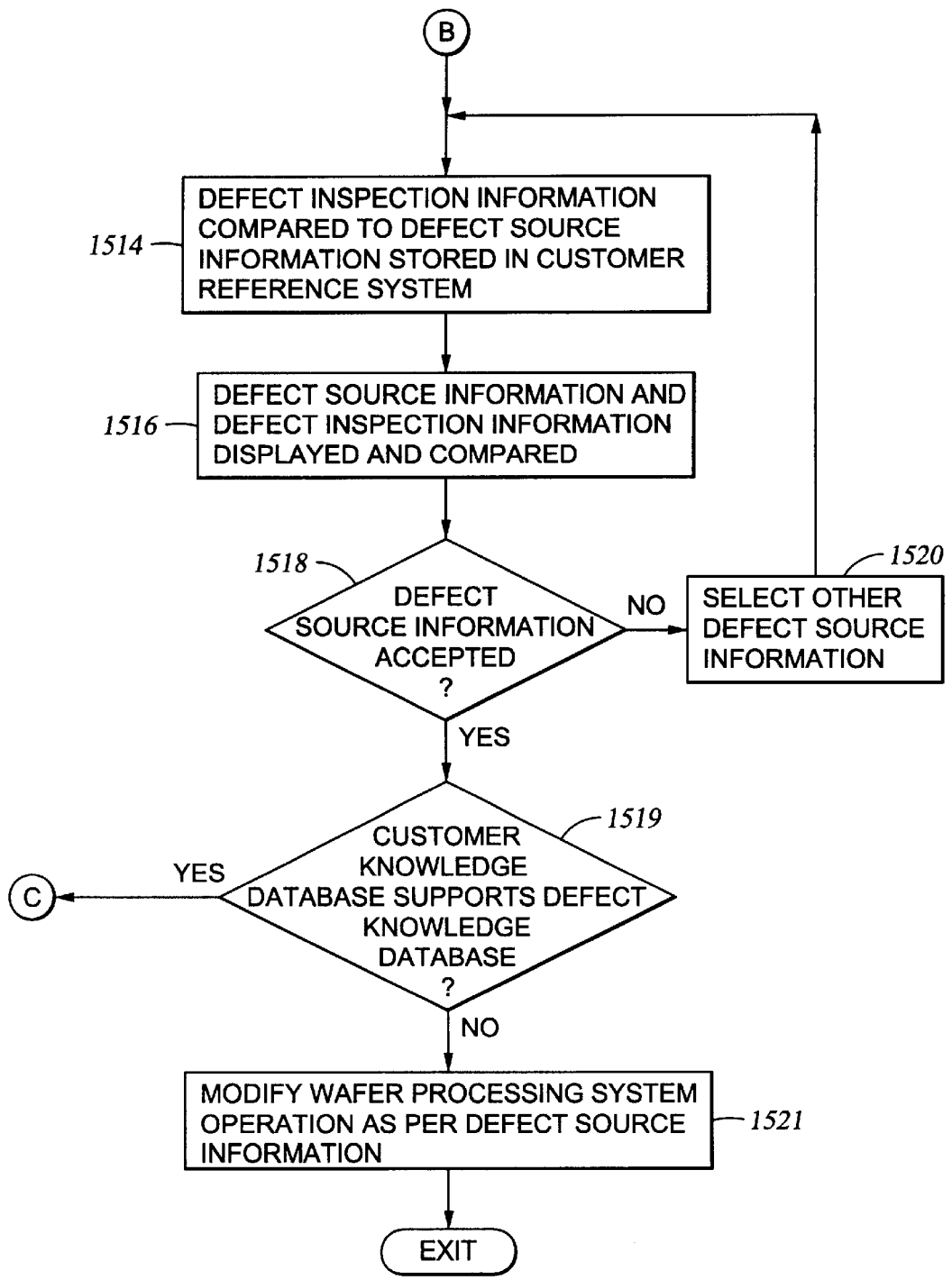

FIG. 15, including FIGS. 15A and 15B, is a flow diagram of one embodiment of a method 1500 performed by the defect source identifier 100 of FIG. 1 to identify defects on wafers. To best understand the operation of this method 1500, the reader should refer to FIGS. 1 and 2 while reading the following description of FIG. 15.

The method 1500 starts with step 1502 in which the wafer processing system 102 processes a wafer in one of the plurality of process cells 103. The wafer is then displaced, typically using robots 121, to a metrology cell 124 as shown in step 1504. In step 1506, the wafer is inspected for defects using a metrology tool such as a scanning electron microscope process 206 or a wafer defect inspection process 204 while the wafer is in the metrology cell 124. The wafer defect inspection process typically stores the defect inspection information as a KLA file. Similarly, the scanning electron microscope process, shown as 206 in the embodiment in FIG. 2, typically stores its defect inspection information as a KLA file.

The method 1500 transmits the defect inspection information from the wafer processing system 102 to the client computer 105 in step 1508. The defect inspection information is originally stored in the defect management database process 208 shown in FIG. 2. The method 1500 continues to decision step 1510 that determines whether the customer knowledge database process 218 exists. If the answer to the decision step 1510 is yes, then the method 1500 continues to step 1514.

In step 1514, defect inspection information obtained from the metrology tools (e.g. the scanning electron microscope process 206 or the wafer defect inspection process 204) is compared to the defect source information representing the case histories stored in the customer knowledge database process 218. A source of the wafer defect is determined by comparing the defect to the case histories to the defect source information corresponding to prior defects stored in the customer knowledge system. The stored contents of the customer knowledge database process 218 is typically smaller, and includes fewer defect history cases, than the defect knowledge system database process 216. However, if any particular defect source identifier client 104 is operated for a considerable time, the size and utility of the customer knowledge database process will increase.

In one embodiment of method 1500, the defect source information and the defect inspection information are both displayed on a graphical user interface (GUI) associated with a client computer 105 in an image compare screen step 1516. The defect inspection information in step 1516 is similar to the image compare screen shown in FIG. 12. The method 1500 continues to step 1518, in which the defect source identifier client 104 determines if the displayed defect source information is acceptable in that the cause of the case history defect in the defect source information is actually the cause of the present defect in the defect inspection information. Such determination of acceptability is determined either based upon a skilled user determining that the displayed defect is similar to the case history defect, or a correlation program in the client computer 105 providing the same determination. If the query in step 1518 is answered yes, then method 1500 continues to decision step 1519.

In decision step 1519, the defect source identifier 100 determines whether the customer knowledge database process supports the defect knowledge database process. If a particular customer knowledge database process 218 does not support the defect knowledge database process 216, as determined by step 1519, then the customer knowledge database process 218 will not be granted access to the defect knowledge database process 216, and the method 1500 continues to step 1521. In step 1521, the operating of the wafer processing system 102 is modified to remedy the processing situation that created the defects on the wafer according to the recommended operation changes to the wafer processing system included in the case history. This modification of the operation of the wafer processing system can be performed manually by a user viewing the defect source information, or automatically by the client computer 105 altering the operation of the wafer processing system. Following step 1521, the method 1500 terminates.

If the answer to the query in step 1518 is no, then the method 1500 continues to step 1520 wherein the user accesses new source defect information. This may be provided by a user selecting new defect source information that contains different defect sources and solutions, one of the multiple causes shown in 708 in FIG. 7. If the user wants to select another cause for the defect that includes further defect source information, then the method 1500 continues to loop back to decision step 1512.

If the answer to decision step 1519 is yes, the method continues to step 1522. Also, if the answer in decision step 1510 is yes, then the method 1500 continues to step 1522. In step 1522, the selected defect for each defect on the wafer is sent to the server computer 107. There may be a plurality of selected defects associated with each wafer. The method 1500 continues to step 1524, in which the defect inspection information is compared to defect source information stored in the defect knowledge database process 216 that is typically stored in the memory 162B of the defect source identifier server 106*b*.

The method 1500 continues to step 1526 wherein the defect knowledge database process is accessed by the defect source identifier server 106 to derive potential causes based on defect inspection information for each defect located on the wafer. A compilation of selected defect cause information is transmitted back to the defect source identifier client 104. The method 1500 continues to step 1528 to utilize the selected defect cause information. In one embodiment, the utilization of the defect cause information includes displaying selected causes from the defect cause information on the defect summary screen 702 shown in FIG. 7.

The method 1500 then continues to step 1530 in which a user, proximate the defect source identifier client 104, interfaces with the client computer 105 to select one defect cause from the selected defect cause information for each particular wafer defect. The defect causes are listed, e.g., in the cause section 708 in the embodiment of defect summary screen shown in FIG. 7. The user selects one of the defect sources listed in the cause section by, e.g. "clicking on" that particular cause. The method 1500 then continues to step 1534 wherein the selected defect cause is transmitted from the defect source identifier client 104 to the defect source identifier server 106.

The method 1500 continues to step 1536 in which the defects source information, including the selected defect cause, is generated in the server computer in response to the selected defect cause transmitted in step 1534. The defect source information generated in step 1536 is included as part of the defect knowledge database process 216 included in the embodiment of defect source identifier server 106 shown in FIG. 1. The method 1500 continues to step 1538 in which the defect source information is transmitted to the defect source identifier client 104.

The method continues to step 1540 in which defect source information is displayed as an image or over an image compare screen, one embodiment shown in FIG. 12, along with the defect inspection information derived in step 1506. The image compare screen is displayed at the defect source identifier client 104. The user can view the displayed images over the image compare screen, and determine if he/she is satisfied with the correlation between the defect shown in the defect source information and the defect shown in the defect inspection information contained in the image compare screen. The client computer 105 running a correlation program can provide a similar determination.

The method 1500 continues to step 1542 wherein the defect cause is accepted, or not accepted, by the user or the defect source identifier client 104 indicating whether the defect source information is sufficiently closely correlated to the defect inspection information. If the answer to the decision step 1542 is yes, then the method 1500 continues to step 1544. By comparison, if the defect cause is not accepted by the user at step 1542, then the method continues looping back to step 1530.

In one embodiment of step 1544, the user interfaces with the defect source identifier client 104 to manually correct the operation of the wafer processing system according to the displayed defect source information. In another embodiment of step 1544, the defect source identifier client 104 automatically applies a solution displayed by the defect source information over the display at the defect source identifier client 104 by altering the operation of the wafer processing system 102 to remedy the source of the defect.

For example, if the source of the defect (the defect cause) is that the process cell is dirty, the process cell will be operated in a clean mode for a prescribed duration. If the defect cause indicates that the process is operating at an undesired temperature, pressure, or recipe, then the conditions in the wafer processing system 102, e.g., the process cell 103, will be altered. These corrections to the conditions in the wafer processing system 102 to limit the defect occurrences can be performed automatically, or they can be input by a system operator altering the settings or conditions at the wafer processing system 102.

In those defect source identifier systems 100 in which a customer knowledge database process supports the defect knowledge database process, a larger defect knowledge database process, indicated as 216 in FIG. 2, that is stored in the defect source identifier server 106, may be accessed by the user. Following step 1544, the method 1500 terminates at step 1545.

Although various embodiments that incorporate the teachings of the present invention have been shown and described in detail herein, those skilled in the art can readily devise many other varied embodiments that still incorporate these teachings.

What is claimed is:

1. A method of analyzing defects on semiconductor wafers comprising:

identifying defects on the semiconductor wafer;

creating defect inspection information within a plurality of substantially similar defect source identifier clients, the defect inspection information containing information regarding the identified defects;

transmitting the defect inspection information through a network to a defect source identifier server;

deriving defect source information at the defect source identifier server in response to the defect inspection information from the plurality of substantially similar defect source information clients;

deriving a defect solution at the defect source identifier server in response to the derived defect source information;

transmitting the defect source information and the defect solution from the defect source identifier server to one or more of the substantially similar defect source identifier clients; and utilizing the defect source information and the defect solution at the one or more of the plurality of substantially similiar defect source identifier clients.

2. The method of claim 1, further comprising:

providing customer knowledge database information at the defect source identifier client; and displaying the customer knowledge database information at the defect source identifier client.

3. The method of claim 2, wherein the defect source information and the customer knowledge database information are displayed simultaneously at the defect source identifier client.

4. The method of claim 1, further comprising:

providing defect knowledge information at the defect source identifier server;

transmitting the defect knowledge information from the defect source identifier server to the defect source identifier client; and displaying the defect knowledge information at the defect source identifier client.

5. The method of claim 4, wherein the transmission of the defect knowledge information from the defect source identifier server to the defect source identifier client is controlled by user input at the defect source identifier client.

6. The method of claim 4, wherein the defect source information and the defect knowledge information are displayed simultaneously at the defect source identifier client.

7. The method of claim 1, wherein the defects on the semiconductor wafer are identified with the wafers located in a metrology cell in a wafer processing system.

8. The method of claim 1, wherein the utilizing the defect solution information involves displaying defect solutions to the defect at the defect source identifier client in response to the defect solution information.

9. The method of claim 1, wherein the utilizing the defect solution information involves altering the operation of a wafer processing system.

10. An apparatus providing defect sources for semiconductor wafers comprising:

a plurality of wafer processing systems configured to process wafers and to identify defects on the semiconductor wafers;

a defect source identifier client coupled to each of the wafer processing systems in said plurality of wafer processing systems for generating defect inspection information in response to the identified defects;

a defect source identifier server in communication with each of the defect source identifier clients, each of the defect source identifier clients transmitting the defect inspection information to the defect source identifier server, the defect source identifier server deriving defect source information in response to the defect inspection information from the plurality of the defect source identifier clients, wherein the defect source information is transmitted from the defect source identifier server to the defect source identifier client; and the defect source identifier clients utilize the defect source information to provide a solution to the wafer processing systems for the defect.

11. The apparatus of claim 10, wherein operation of the wafer processing system is automatically modified in response to the solution.

12. The apparatus of claim 10, wherein the solution is displayed on a display at the defect source identifier client so an operator can modify operation of the wafer processing system in response to the displayed solution.

13. A method of analyzing defects on semiconductor wafers comprising:

identifying defects on the semiconductor wafer;

creating defect inspection information within a plurality of substantially similar defect source identifier clients, the defect inspection information containing information regarding the identified defects;

transmitting the defect inspection information through a network to a defect source identifier server;

deriving defect cause information in response to the defect inspection information at the defect source identifier server;

transmitting a selected defect cause information to the defect source identifier server;

deriving a selected cause at the defect source identifier server in response to the selected defect cause information;

transmitting the selected cause from the plurality of substantially similar defect source identifier clients to the defect source identifier server;

deriving defect source information at the defect source identifier server in response to the selected cause;

transmitting the defect source information from the defect source identifier server to one or more of the plurality of substantially similar defect source identifier clients; and utilizing the defect source information at one or more of the plurality of substantially similar defect source identifier clients.

14. The method of claim 13, wherein the derived defect source information relates to the same defect as the selected cause.

15. The method of claim 13, wherein the defect cause information is selected in response to the defect inspection information by correlation.

16. The method of claim 13, further comprising:

providing customer knowledge information at the defect source identifier client; and displaying the customer knowledge information at the defect source identifier client.

17. The method of claim 16, wherein the defect source information and the customer knowledge information are displayed simultaneously at the defect source identifier client.

18. The method of claim 13, further comprising:

providing defect knowledge information at the defect source identifier server;

transmitting the defect knowledge information from the defect source identifier server to the defect source identifier client; and displaying the defect knowledge information at the defect source identifier client.

19. The method of claim 18, wherein the transmission of the defect knowledge information from the defect source identifier server to the defect source identifier client is controlled by user input at the defect source identifier client.

20. The method of claim 18, wherein the defect source information and the defect knowledge information are displayed simultaneously at the defect source identifier client.

21. The method of claim 13, wherein the defects on the semiconductor wafer are identified in a metrology cell in a wafer processing system.

22. The method of claim 13, wherein the utilizing the defect solution information involves displaying defect solutions to the defect at the defect source identifier client in response to the defect solution information.

23. The method of claim 13, wherein the utilizing the defect solution information involves altering the operation of the wafer processing system.

* * * * *